United States Patent
Yamashita

(10) Patent No.: US 9,159,893 B2
(45) Date of Patent: Oct. 13, 2015

(54) LIGHT EMITTING DEVICE INCLUDING LEAD HAVING TERMINAL PART AND EXPOSED PART, AND METHOD FOR MANUFACTURING THE SAME

(75) Inventor: Ryohei Yamashita, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 13/820,372

(22) PCT Filed: Sep. 1, 2011

(86) PCT No.: PCT/JP2011/069917
§ 371 (c)(1),
(2), (4) Date: Mar. 4, 2013

(87) PCT Pub. No.: WO2012/029911
PCT Pub. Date: Mar. 8, 2012

(65) Prior Publication Data
US 2013/0156058 A1    Jun. 20, 2013

(30) Foreign Application Priority Data

Sep. 3, 2010 (JP) ................................ 2010-198377
Nov. 11, 2010 (JP) ................................ 2010-253158

(51) Int. Cl.
H01L 33/48 (2010.01)
H01L 33/62 (2010.01)
H01S 5/022 (2006.01)

(52) U.S. Cl.
CPC .............. *H01L 33/62* (2013.01); *H01L 33/486* (2013.01); *H01S 5/02244* (2013.01); *H01L 2224/48247* (2013.01)

(58) Field of Classification Search
CPC .............................. H01L 33/486; H01L 33/62
See application file for complete search history.

(56) References Cited

U.S. PATENT DOCUMENTS

| | | | | |
|---|---|---|---|---|
| 5,977,630 | A * | 11/1999 | Woodworth et al. | 257/712 |
| 8,319,248 | B2 * | 11/2012 | Seo | 257/99 |
| 2005/0151149 | A1 * | 7/2005 | Chia et al. | 257/99 |
| 2006/0220233 | A1 | 10/2006 | Ito et al. | |
| 2009/0179219 | A1 * | 7/2009 | Kim et al. | 257/99 |

(Continued)

FOREIGN PATENT DOCUMENTS

| | | |
|---|---|---|
| JP | 2007-134376 A | 5/2007 |
| JP | 2010-003743 A | 1/2010 |
| JP | 2010-062272 A | 3/2010 |

OTHER PUBLICATIONS

The extended European search report for the corresponding European application No. 11821926.0, issued on Jul. 30, 2015.

*Primary Examiner* — Thanh V Pham
(74) *Attorney, Agent, or Firm* — Global IP Counselors, LLP

(57) ABSTRACT

A light emitting device includes a substantially cuboid package made up of a molded article and a lead that is embedded in the molded article, and a light emitting element that is installed in the package. The lead has a connector where the light emitting element is installed, and a terminal part and an exposed part that are linked to the connector. The package has a bottom face, a front face that is a light emission face contiguous with the bottom face, and a rear face that is contiguous with the bottom face and is opposite the front face. The first terminal part and the exposed part are linked to the rear face side of the connector are exposed from the molded article and contiguous with the bottom face and the rear face, and are isolated at the bottom face.

7 Claims, 24 Drawing Sheets

(56) References Cited

U.S. PATENT DOCUMENTS

2009/0315068 A1 12/2009 Oshio et al.
2010/0025722 A1 2/2010 Wada
2011/0210354 A1 9/2011 Ichikawa et al.

* cited by examiner

LIGHT EMITTING DEVICE INCLUDING LEAD HAVING TERMINAL PART AND EXPOSED PART, AND METHOD FOR MANUFACTURING THE SAME

CROSS-REFERENCE TO RELATED APPLICATIONS

This application claims priority to Japanese Patent Application No. 2010-198377 filed on Sep. 3, 2010 and Japanese Patent Application No. 2010-253158 filed on Nov. 11, 2010, the disclosures of which are hereby incorporated herein by reference in their entirety.

TECHNICAL FIELD

The technology disclosed herein relates to a light emitting device equipped with a light emitting element, to a package array for a light emitting device, and to a method for manufacturing a package array for a light emitting device.

BACKGROUND INFORMATION

Light emitting devices comprising a light emitting element (such as a light emitting diode or a laser diode) and a package on which the light emitting element is mounted have been widely used in the past as the light source for LCD television backlights, lighting fixtures, optical communications devices, and so forth. The package comprises a molded article made of resin, and a flat connector that is embedded in the molded article and is electrically connected to the light emitting element. The connector has a connection face that is electrically connected to the light emitting element, a rear face that is opposite the connection face, and a side face that is contiguous with the connection face and the rear face.

Light emitting devices are generally classified as either a top-view type or a side-view type, according to the direction in which the light emitted by the light emitting element is taken off. With a top-view type of light emitting device, the emitted light from a light emitting element 10 is taken off in a direction perpendicular to a mounting face of a mounting board. With a side-view type of light emitting device, the emitted light from the light emitting element is taken off in a direction that is parallel to the mounting face of the mounting board.

There is a known top view type of light emitting device in which the connection face and the side face are embedded in the molded article and the rear face is exposed from the molded article at the outer edge of the connector (see Japanese Laid-Open Patent Application Publication No. 2010-62272). With a top-view light emitting device such as this, the connection face can be made larger in a direction parallel to the mounting face, so adequate contact surface area can be ensured between the molded article and the connector.

SUMMARY

With a side view type of light emitting device, however, a flat connector is generally disposed in a state of being erect perpendicular to the mounting face. Accordingly, when the connector is made larger in a direction perpendicular to the mounting face, the center of gravity of the light emitting device rises, which makes the light emitting device more prone to toppling, so there is a limit to how much the connection face can be enlarged in a direction perpendicular to the mounting face. Also, the depth of a side view type of light emitting device is far less than the depth of a top view type of light emitting device, and this also makes it more difficult to enlarge the side face.

Thus, with a side-view light emitting device with which it is difficult to make the connection face and side face larger, adequate contact surface area cannot be ensured between the molded article and the connector, which makes it difficult to increase the adhesion between the molded article and a lead.

The technology disclosed herein was conceived in light of the above situation, and it is an object thereof to provide a light emitting device, a package array for a light emitting device, and a method for manufacturing a package array for a light emitting device, with which adhesion between a molded article and a lead can be increased.

The light emitting device disclosed herein comprises a substantially cuboid package constituted by a molded article and a lead embedded in the molded article, and a light emitting element that is installed in the package. The lead has a connector on which a light emitting element is installed, and a terminal part and an exposed part that are linked to the connector. The package has a bottom face, a light emission face that is contiguous with the bottom face, and a rear face that is contiguous with the bottom face and opposite the light emission face. The terminal part and the exposed part are linked to a rear face side of the connector, and are continuously exposed from the molded article at the bottom face and rear face. The terminal part and the exposed part are apart from each other at the bottom face.

The technology disclosed herein provides a light emitting device, a package array for a light emitting device, and a method for manufacturing a package array for a light emitting device, with which adhesion between a molded article and a lead can be increased.

DETAILED DESCRIPTION OF EMBODIMENTS

Embodiments of the present invention will now be described through reference to the drawings. In the discussion of the drawings below, portions that are the same or similar will be given the same or similar numbers. The drawings, however, are merely representations, and the proportions of the various dimensions may vary from those in actuality. Therefore, specific dimensions and so forth should be decided on by referring to the following description. Also, the dimensional relations and proportions of some portions may, of course, vary from one drawing to the next.

First Embodiment

Summary of First Embodiment

In the first embodiment we will describe a light emitting device with which adhesion between a molded article and a lead can be increased, and a method for manufacturing this device. More specifically, the lead of the light emitting device has a flat connector and an exposed part that is linked to the connector. The molded article has a grasping part for grasping part of the outer edge of the connector.

The configuration of the light emitting device and the method for manufacturing this device will now be described in order.

Configuration of Light Emitting Device

Figure 1:
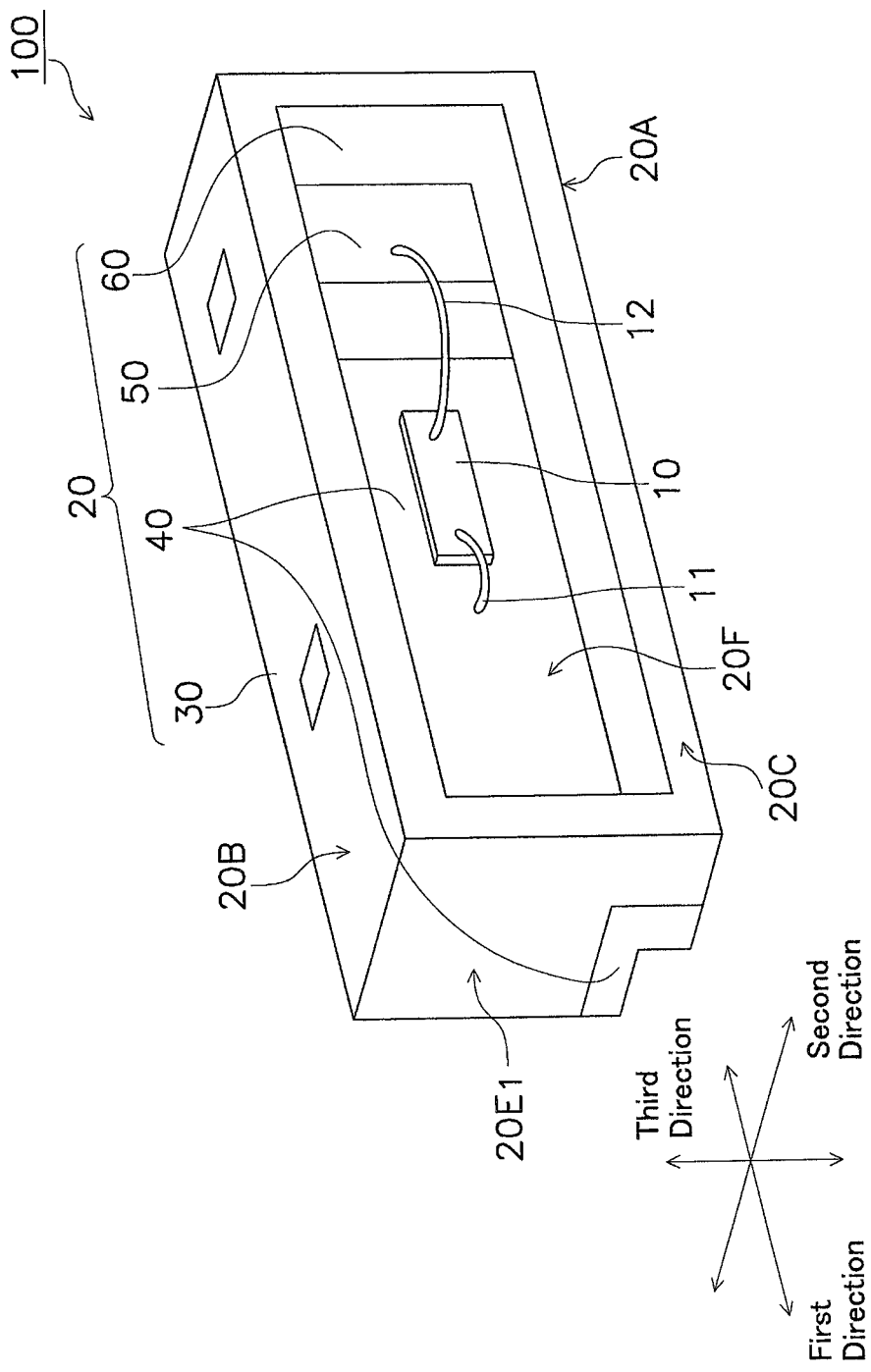
FIG. 1 is an oblique view of a light emitting device 100 pertaining to a first embodiment, as seen from the front.
Figure 2:
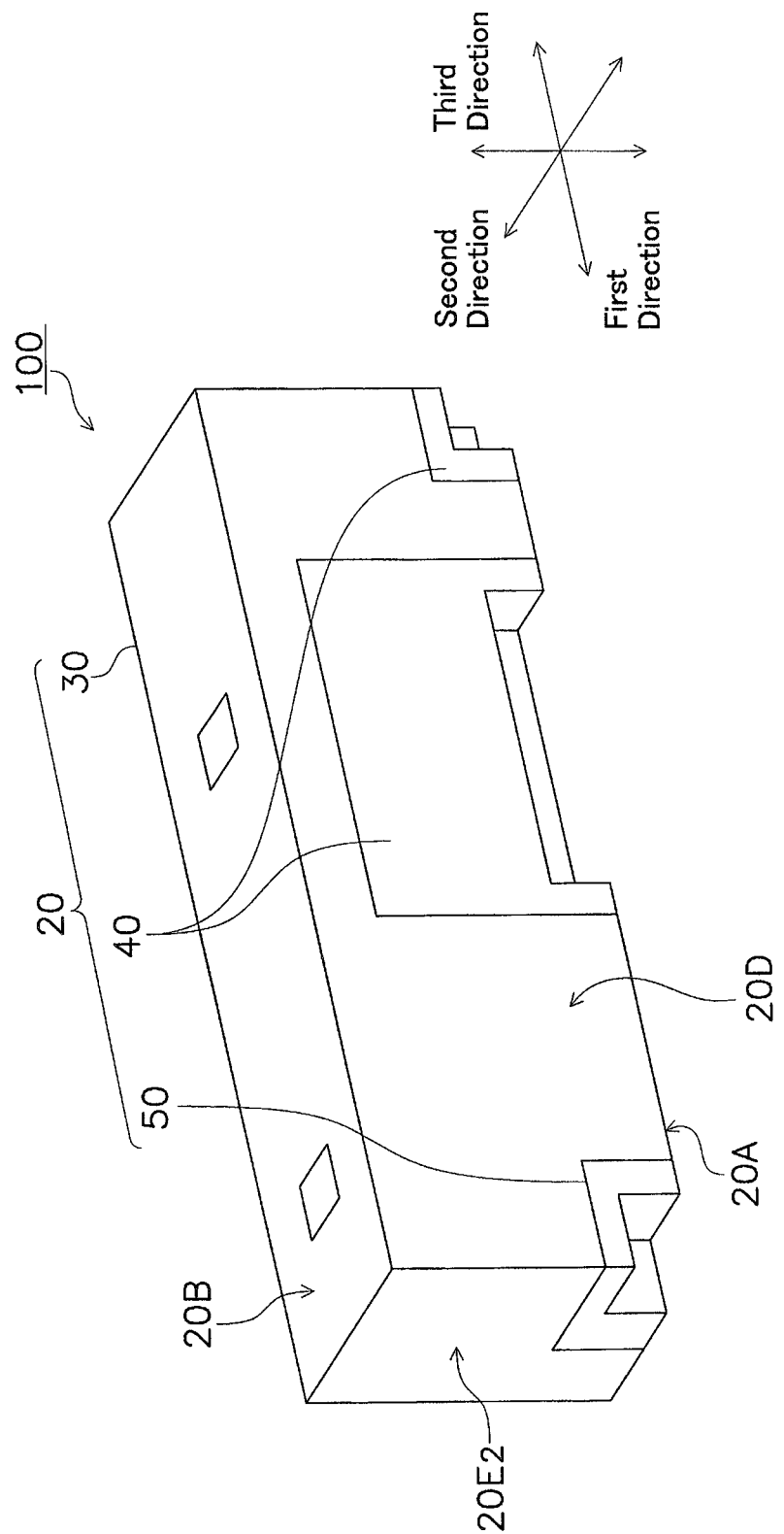
FIG. 2 is an oblique view of the light emitting device 100 pertaining to the first embodiment, as seen from the rear.

The configuration of the light emitting device pertaining to the first embodiment will be described through reference to the drawings. FIG. 1 is an oblique view of a light emitting device 100 pertaining to the first embodiment, as seen from the front. FIG. 2 is an oblique view of a light emitting device 100 pertaining to the first embodiment, as seen from the rear.

The light emitting device 100 comprises a light emitting element 10 and a package 20. The light emitting device 100 pertaining to this embodiment is what is known as a side-view type of light emitting device, and light emitted from the light emitting element 10 is taken off in a direction parallel to a bottom face 20A.

In this embodiment, the light emitting device 100 has a substantially cuboid shape that extends along a first direction parallel to the mounting face 200A. In this embodiment, the size of the light emitting device 100 is approximately 3 mm in the first direction, about 1 mm in a direction parallel to the mounting face 200A and perpendicular to the first direction (hereinafter referred to as the "second direction"), and about 1 mm in a direction perpendicular to the first direction and the second direction (hereinafter referred to as the "third direction"). The size of the light emitting device 100 is not limited to this, however.

Light Emitting Element 10

The light emitting element 10 is placed in the package 20. The light emitting element 10 is electrically connected to the package 20 via a first wire 11 and a second wire 12.

The light emitting element 10 is formed in a flat shape, and is disposed perpendicular to the second direction. The emitted light from the light emitting element 10 is taken off in a direction parallel to the second direction, from a front face opening 20F (discussed below).

The light emitting element 10 is a semiconductor light emitting element called a light emitting diode, for example. The light emitting element 10 preferably has as its light emitting layer a semiconductor such as GaAlN, ZnS, SnSe, SiC, GaP, GaAlAs, AlN, InN, AlInGaP, InGaN, GaN, or AlInGaN on a substrate, but is not limited to this.

A face-up structure or a face-down structure can be employed for the light emitting element 10. There are no particular restrictions on the size of the light emitting element 10, but examples include 350 μm square, 500 μm square, and 1 mm square.

Package 20

In this embodiment, the package 20 has a substantially cuboid shape that extends in the first direction. The package 20 has a bottom face 20A, a top face 20B, a front face 20C, a rear face 20D, a first side face $20E_1$, and a second side face $20E_2$.

The bottom face 20A hits a mounting face (not shown) when the light emitting device 100 is mounted. The top face 20B is provided opposite the bottom face 20A. The front face 20C is contiguous with the bottom face 20A and the top face 20B. The front face 20C has the front face opening 20F. The front face opening 20F guides the light emitted from the light emitting element 10 to outside the package 20. The light emitting element 10 is placed on a first connection face 41A (see FIG. 3) exposed in the interior of the front face opening 20F. The rear face 20D is contiguous with the bottom face 20A and the top face 20B, and is provided opposite the front face 20C. The rear face 20D is perpendicular to the second direction. The boundary between the rear face 20D and the bottom face 20A is parallel to the first direction. The first side face $20E_1$ is contiguous with the rear face 20D and the front face 20C. The second side face $20E_2$ is provided opposite the first side face $20E_1$. The first side face $20E_1$ and the second side face $20E_2$ are perpendicular to the first direction.

The package 20 is made up of a molded article 30, a first lead 40, a second lead 50, and a sealing resin 60.

(1) Molded Article 30

The molded article 30 forms the outer shape of the package 20. Therefore, the outer surface of the molded article 30 forms the majority of the bottom face 20A, the top face 20B, the front face 20C, the rear face 20D, the first side face $20E_1$, and the second side face $20E_2$ of the package 20. As shown in FIGS. 1 and 2, parts of the first lead 40 and the second lead 50 are exposed on the outer surface of the molded article 30.

The molded article 30 is heat resistant and has the required strength, and is made of an electrically insulating material that does not readily transmit outside light, the light emitted from the light emitting element 10, or other such light. A favorable example of this material is a triazine derivative epoxy resin, which is a thermosetting resin. This thermosetting resin may contain an acid anhydride, an antioxidant, a parting agent, a light reflecting member, an inorganic filler, a curing catalyst, a light stabilizer, and a lubricant. Titanium dioxide, added in an amount of 0 to 90 wt %, and preferably 10 to 60 wt %, can be used as the light reflecting member. The material of the molded article 30 is not limited to this, however, and can be, for example, one or more types of thermosetting resin selected from among epoxy resins, modified epoxy resins, silicone resins, modified silicone resins, acrylate resins, and urethane resins. Epoxy resins, modified epoxy resins, silicone resins, and modified silicone resins are particularly favorable as the material for the molded article 30. A thermoplastic resin may also be used, such as a liquid crystal polymer, a polyphthalamide resin, or polybutylene terephthalate (PBT).

(2) First Lead 40 and Second Lead 50

The first lead 40 and the second lead 50 are preferably made of a material having a relatively high thermal conductivity (such as at least about 200 W/(m·K)). Examples of such a material include one or more layers of nickel, gold, copper, silver, molybdenum, tungsten, aluminum, iron, or another such metal, or of an iron-nickel alloy, phosphor bronze, ferrous copper, or another such alloy. The surfaces of the first lead 40 and the second lead 50 may also be plated.

The majority of the first lead 40 and the second lead 50 is embedded in the molded article 30, and just parts of the first lead 40 and the second lead 50 are exposed from the molded article 30. Specifically, just parts of the first lead 40 and the second lead 50 can be seen from the outside of the package 20. The configuration of the first lead 40 and the second lead 50 will be discussed below.

(3) Sealing Resin 60

The sealing resin 60 is packed into the interior of the front face opening 20F, and seals the light emitting element 10. The sealing resin 60 adheres to the molded article 30, the first lead 40 (more specifically, a first connection face 41A of a first connector 41 (discussed below)), and the second lead 50 (more specifically, a second connection face 51A of a second connector 51 (discussed below)). Consequently, the sealing resin 60 holds down the molded article 30, the first lead 40, and the second lead 50. This sealing resin 60 can be a translucent resin, such as one or more types of resin selected from among polyolefin resins, polycarbonate resins, polystyrene resins, epoxy resins, acrylic resins, acrylate resins, methacrylic resins (PMMA, etc.), urethane resins, polyimide resins, polynorbornene resins, fluororesins, silicone resins, modified silicone resins, and modified epoxy resins. This material may also contain a diffusion agent, filler, pigment, fluorescent substance, etc., as discussed in Japanese Laid-Open Patent Application 2006-229055 and WO2006/038502.

Lead Configuration

Figure 3:
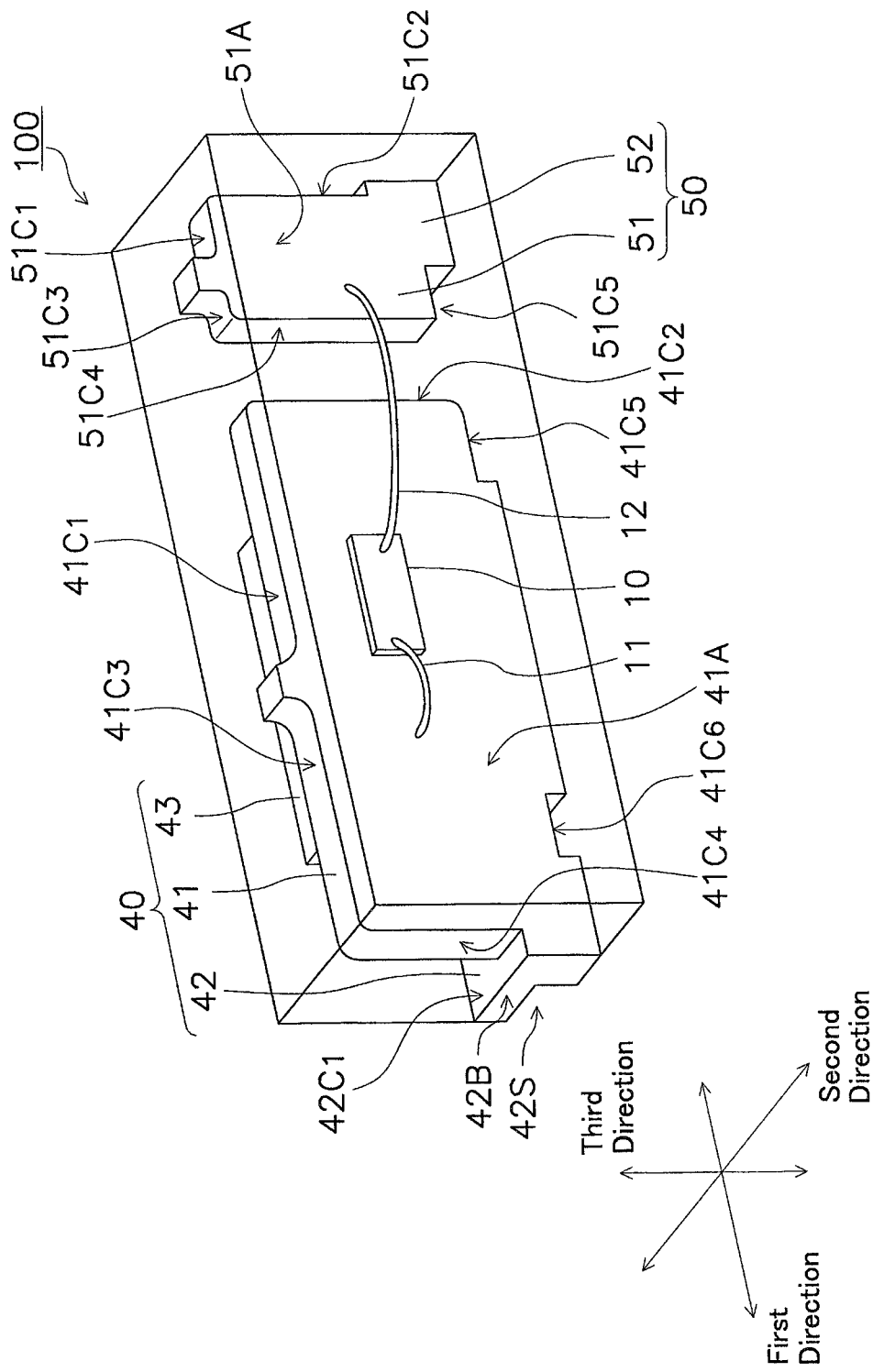
FIG. 3 is a see-through view of FIG. 1.
Figure 4:
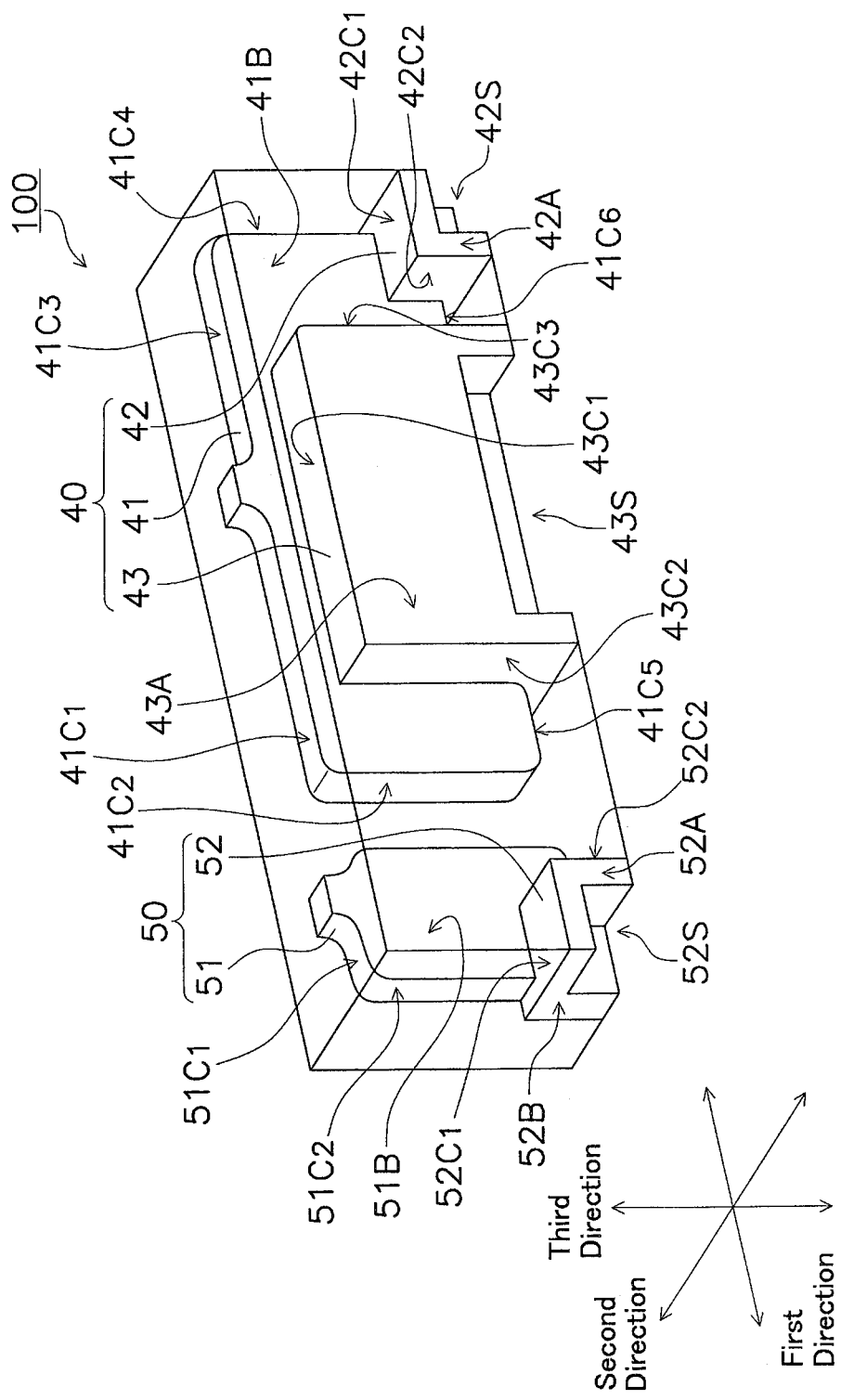
FIG. 4 is a see-through view of FIG. 2.
Figure 5:
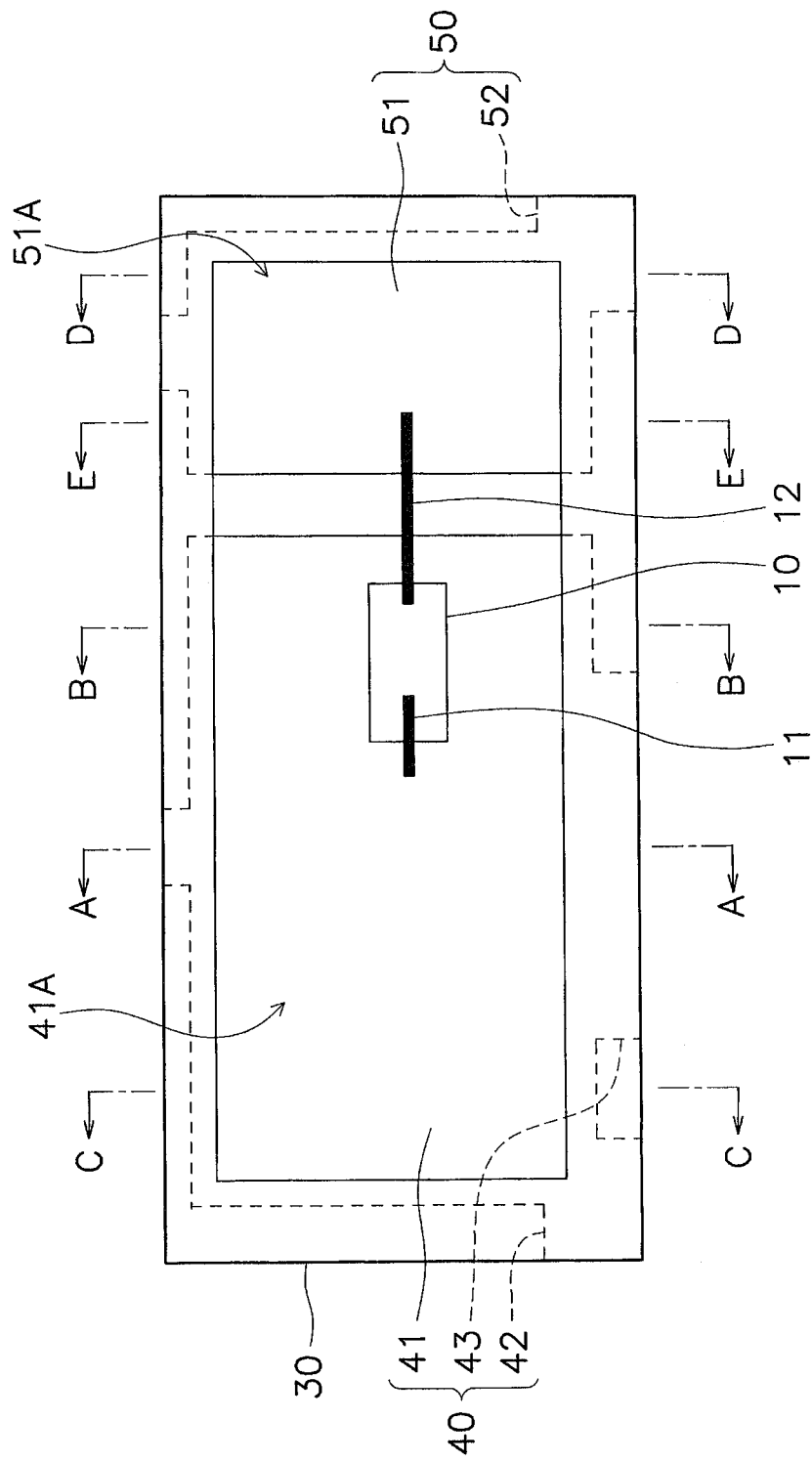
FIG. 5 is a plan view of a front face 20C of the light emitting device 100 pertaining to the first embodiment.

Next, the configuration of the leads pertaining to the first embodiment will be described through reference to the drawings. FIG. 3 is a see-through view of FIG. 1. FIG. 4 is a see-through view of FIG. 2. FIG. 5 is a plan view of a front face 20C of the light emitting device 100 pertaining to the first embodiment. In FIGS. 3 and 4, the molded article 30 is shown in outline.

Configuration of First Lead 40

The first lead 40 is made up of a first connector 41, the first terminal part 42 and an exposed part 43. In this embodiment, the first terminal part 42 and the exposed part 43 are integrally linked to the first connector 41.

(1) First Connector 41

The first connector 41 is formed in a flat shape, and is disposed along the rear face 20D. The first connector 41 is an example of a "connector" to which a light emitting element is electrically connected, and has the first connection face 41A, a first rear face 41B, and first to sixth connector side faces $41C_1$ to $41C_6$.

The first connection face 41A is exposed from the molded article 30 in the interior of the front face opening 20F. The light emitting element 10 is placed in the first connection face 41A, and the first wire 11 is also connected to the first connection face 41A. This electrically connects the first connector 41 to the light emitting element 10. The first connection face 41A is sealed by the sealing resin 60 (see FIG. 1). The first rear face 41B is provided opposite the first connection face 41A. The first rear face 41B is embedded in the molded article 30.

The first to sixth connector side faces $41C_1$ to $41C_6$ are each provided parallel to the second direction. The first to sixth connector side faces $41C_1$ to $41C_6$ are embedded in the molded article 30.

The first connector side face $41C_1$ (an example of a first connector side face) is contiguous with the first connection face 41A and the first rear face 41B. In this embodiment, the first connector side face $41C_1$ is parallel to the top face 20B of the package 20. The second connector side face $41C_2$ (an example of a second connector side face) is contiguous with the first rear face 41B and the first connector side face $41C_1$. In this embodiment, the second connector side face $41C_2$ is parallel to the second side face $20E_2$ of the package 20. The third connector side face $41C_3$ is contiguous with the first connection face 41A and the first rear face 41B. In this embodiment, the third connector side face $41C_3$ is parallel to the top face 20B of the package 20. The fourth connector side face $41C_4$ is contiguous with the first rear face 41B and the third connector side face $41C_3$. In this embodiment, the fourth connector side face $41C_4$ is opposite the second connector side face $41C_2$. The fifth connector side face $41C_5$ is contiguous with the first connector 41, the first rear face 41B, and the second connector side face $41C_2$. In this embodiment, the fifth connector side face $41C_5$ is opposite the first connector side face $41C_1$. The sixth connector side face $41C_6$ is contiguous with the first connection face 41A and the first rear face 41B. The sixth connector side face $41C_6$ is contiguous with the first terminal part 42 and the exposed part 43. In this embodiment, the sixth connector side face $41C_6$ is opposite the third connector side face $41C_3$.

(2) First Terminal Part 42

The first terminal part 42 is formed in a three-dimensional shape, and is linked to the lower end of the first connector 41 on the first side face $20E_1$ side. The first terminal part 42 is exposed from the molded article 30 at the boundary between the bottom face 20A, the rear face 20D, and the first side face 20E$_1$, and functions as an external electrode of the light emitting device 100.

The first terminal part 42 has a first end face 42A, a second end face 42B, a first connector side face 42C$_1$, a second connector side face 42C$_2$, and a first terminal concavity 42S.

The first end face 42A is exposed from the molded article 30 at the rear face 20D of the package 20. The first end face 42A forms part of the rear face 20D. The second end face 42B is exposed from the molded article 30 at the first side face 20E$_1$ of the package 20. The second end face 42B forms part of the first side face 20E$_1$. The third end face 42C is exposed from the molded article 30 at the bottom face 20A of the package 20.

The first and second terminal part side faces 42C$_1$ and 42C$_2$ are provided parallel to the second direction. The first and second terminal part side faces 42C$_1$ and 42C$_2$ are embedded in the molded article 30.

The first terminal part side face 42C$_1$ is contiguous with the first end face 42A and the first rear face 41B. In this embodiment, the first terminal part side face 42C$_1$ is parallel to the top face 20B of the package 20. The second terminal part end face 42C$_2$ is contiguous with the first end face 42A, the first rear face 41B, and the first terminal part side face 42C$_1$. In this embodiment, the second terminal part end face 42C$_2$ is parallel to the first side face 20E$_1$ of the package 20.

The first terminal concavity 42S is a cut-out formed at the boundary between the bottom face 20A, the rear face 20D, and the first side face 20E$_1$. The first terminal concavity 42S communicates with three faces: the bottom face 20A, the rear face 20D, and the first side face 20E$_1$. When the light emitting device 100 is mounted, the first end face 42A and the second end face 42B are connected to a solder fillet, and part of the solder fillet is held in the first terminal concavity 42S.

(3) Exposed Part 43

The exposed part 43 is formed in an L shape, and is contiguous with the first connector 41. The exposed part 43 is exposed from the molded article 30 at the bottom face 20A and the rear face 20D of the package 20. Consequently, the exposed part 43 functions as a heat sink that dissipates heat generated from the light emitting element 10.

In this embodiment, as shown in FIG. 4, the exposed part 43 is isolated from the first terminal part 42. The exposed part 43 is isolated and exposed from the first terminal part 42 at the bottom face 20A and the rear face 20D.

The exposed part 43 also has a concavity 43S whose opening is contiguous with the bottom face 20A and the rear face 20D. The concavity 43S is a cut-out formed at part of the boundary between the bottom face 20A and the rear face 20D. When the light emitting device 100 is mounted, a solder fillet is housed in the concavity 43S.

Figure 6:
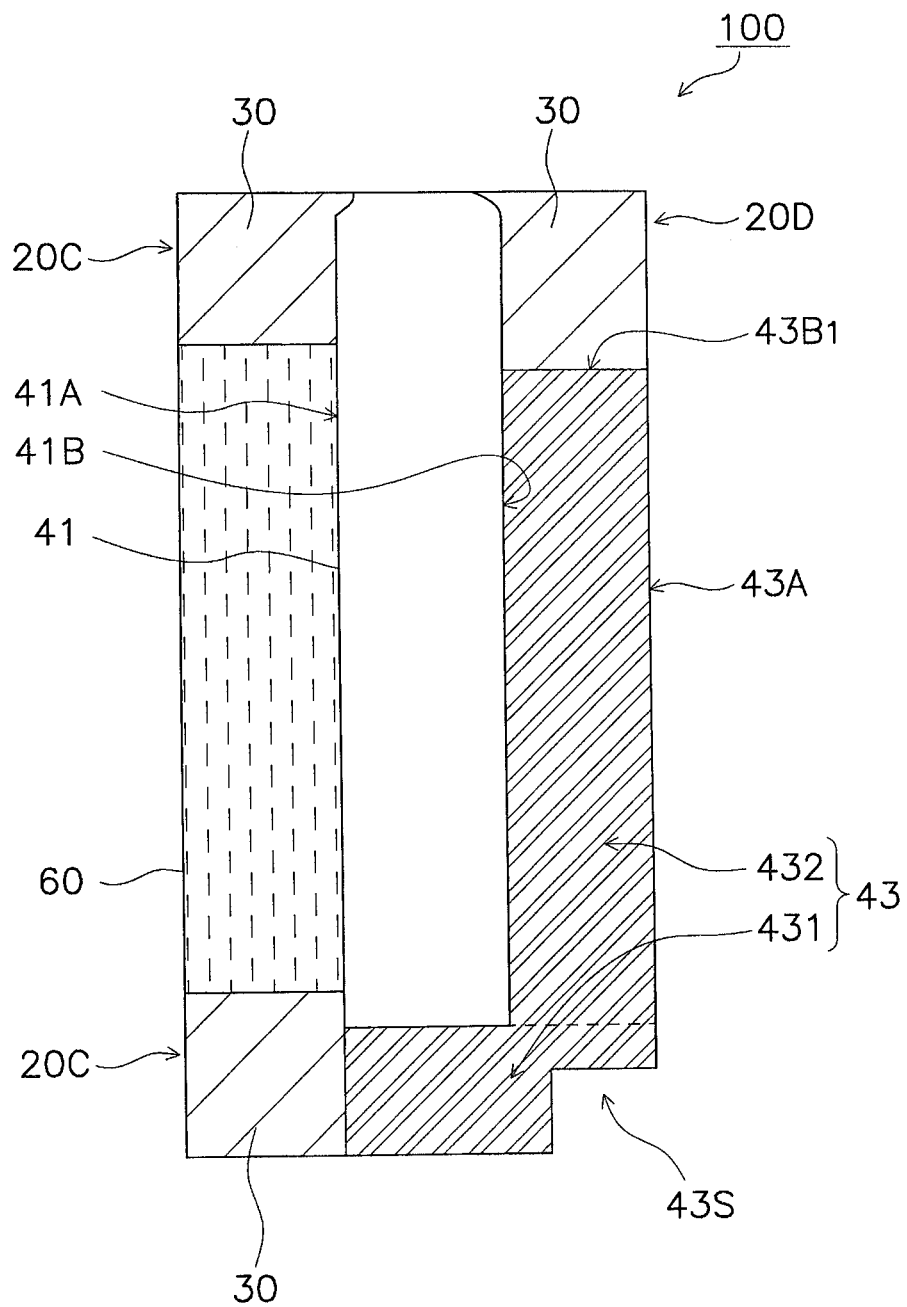
FIG. 6 is a cross section along the A-A line in FIG. 5.

FIG. 6 is a cross section along the A-A line in FIG. 5. As shown in FIG. 6, the exposed part 43 has a base part 431 and a support plate 432.

The base part 431 is disposed on the bottom face 20A of the first connector 41. The base part 431 is the base to the light emitting device 100, and functions as a weight to make the light emitting device 100, which is rather top-heavy, less likely to topple. The base part 431 is exposed at the bottom face 20A. The base part 431 also has the concavity 43S.

The support plate 432 is formed in a flat shape, and is disposed on the rear face 20D side of the first connector 41. Specifically, the support plate 432 is provided on the first rear face 41B of the first connector 41. The support plate 432 is exposed at the rear face 20D. This support plate 432 supports the first connector 41 in the step of forming the molded article 30, as will be discussed below.

The support plate 432 here has an exposed face 43A and first to third support plate side faces 43C$_1$ to 43C$_3$ (see FIG. 4).

The exposed face 43A is exposed from the molded article 30 at the rear face 20D of the package 20. The exposed face 43A forms part of the rear face 20D.

The first to third support plate side faces 43C$_1$ to 43C$_3$ are each provided parallel to the second direction. The first to third support plate side faces 43C$_1$ to 43C$_3$ are embedded in the molded article 30. The first support plate side face 43C$_1$ is contiguous with the exposed face 43A and the first rear face 41B. In this embodiment, the first support plate side face 43C$_1$ is parallel to the first connector side face 41C$_1$. The second support plate side face 43C$_2$ is contiguous with the first rear face 41B and the first support plate side face 43C$_1$. In this embodiment, the second support plate side face 43C$_2$ is parallel to the second connector side face 41C$_2$. The third support plate side face 43C$_3$ is contiguous with the first rear face 41B and the first support plate side face 43C$_1$. In this embodiment, the third support plate side face 43C$_3$ is opposite the second support plate side face 43C$_2$.

Configuration of Second Lead 50

The second lead 50 is made up of a second connector 51 and the second terminal part 52. In this embodiment, the second connector 51 and the second terminal part 52 are formed integrally.

(1) Second Connector 51

The second connector 51 is formed in a flat shape, and is disposed along the rear face 20D. The second connector 51 is an example of a "connector" to which a light emitting element is electrically connected, and has the second connection face 51A, a second rear face 51B, and first to fifth connector side faces 51C$_1$ to 51C$_5$.

The second connection face 51A is exposed from the molded article 30 in the interior of the front face opening 20F. The second wire 12 is connected to the second connection face 51A. The second connection face 51A and the light emitting element 10 are electrically connected. The second connection face 51A is sealed by the sealing resin 60 (see FIG. 1). The second rear face 51B is provided opposite the second connection face 51A. The second rear face 51B is embedded in the molded article 30.

The first to fifth connector side faces 51C$_1$ to 51C$_5$ are each provided parallel to the second direction. The first to fifth connector side faces 51C$_1$ to 51C$_5$ are embedded in the molded article 30.

The first connector side face 51C$_1$ (an example of a "first connector side face") is contiguous with the second connection face 51A and the second rear face 51B. In this embodiment, the first connector side face 51C$_1$ is parallel to the top face 20B of the package 20. The second connector side face 51C$_2$ (an example of a "second connector side face") is contiguous with the second connection face 51A, the second rear face 51B, and the first connector side face 51C$_1$. In this embodiment, the second connector side face 51C$_2$ is parallel to the second side face 20E$_2$ of the package 20. The third connector side face 51C$_3$ is contiguous with the second connection face 51A and the second rear face 51B. In this embodiment, the third connector side face 51C$_3$ is parallel to the top face 20B of the package 20. The fourth connector side face 51C$_4$ is contiguous with the second connection face 51A, the second rear face 51B, and the third connector side face $51C_3$. In this embodiment, the fourth connector side face $51C_4$ is opposite the second connector side face $51C_2$. The fifth connector side face $51C_5$ is contiguous with the first connection face 41A, the first rear face 41B, and the fourth connector side face $51C_4$. In this embodiment, the fifth connector side face $51C_5$ is opposite the third connector side face $51C_3$.

(2) Second Terminal Part 52

The second terminal part 52 is formed in a three-dimensional shape, and is linked to the lower end of the second connector 51 on the second side face $20E_2$ side. The second terminal part 52 is exposed from the molded article 30 at the boundary between the bottom face 20A, the rear face 20D, and the second side face $20E_2$, and functions as an external electrode of the light emitting device 100.

The second terminal part 52 has a first end face 52A, a second end face 52B, a first terminal part side face $52C_1$, a second terminal part side face $52C_2$ and a second terminal concavity 52S.

The first end face 52A is exposed from the molded article 30 at the rear face 20D of the package 20. The first end face 52A forms part of the rear face 20D. The second end face 52B is exposed from the molded article 30 at the second side face $20E_2$ of the package 20. The second end face 52B forms part of the second side face $20E_2$.

The first and second terminal part side faces $52C_1$ and $52C_2$ are each provided parallel to the second direction. The first and second terminal part side faces $52C_1$ and $52C_2$ are embedded in the molded article 30. The first terminal part side face $52C_1$ is contiguous with the first end face 52A and the second rear face 51B. In this embodiment, the first terminal part side face $52C_1$ is parallel to the top face 20B of the package 20. The second terminal part side face $52C_2$ is contiguous with the first end face 52A, the second rear face 51B, and the first terminal part side face $52C_1$. In this embodiment, the second terminal part side face $52C_2$ is parallel to the second side face $20E_2$ of the package 20.

The second terminal concavity 52S is a cut-out formed at the boundary between the bottom face 20A, the rear face 20D, and the second side face $20E_2$. The second terminal concavity 52S communicates with three faces: the bottom face 20A, the rear face 20D, and the second side face $20E_2$. When the light emitting device 100 is mounted, the first end face 52A and the second end face 52B are connected to a solder fillet, and part of the solder fillet is held in the second terminal concavity 52S.

Configuration of Molded Article

Next, the configuration of the molded article pertaining to the first embodiment will be described through reference to the drawings. First, the adhesion of the molded article 30 to the first lead 40 and the second lead 50 will be described through reference to FIGS. 3 and 4.

The molded article 30 is in contact with the first rear face 41B, the first connector side face $41C_1$, and second connector side face $41C_2$ of the first connector 41. Thus, the molded article 30 supports the corner portions of the flat first connector 41 in the first, second, and third directions. The molded article 30 also is in contact with the first support plate side face $43C_1$ of the support plate 432. The molded article 30 is thus connected to the support plate 432.

Similarly, the molded article 30 is in contact with the first rear face 41B, the third connector side face $41C_3$, and the fourth connector side face $41C_4$ of the first connector 41. Thus, the molded article 30 supports the corner portions of the flat first connector 41 in the first, second and third directions. The molded article 30 also is in contact with the first support plate side face $43C_1$ of the support plate 432. The molded article 30 is thus connected to the support plate 432.

Similarly, the molded article 30 is in contact with the first rear face 41B, the second connector side face $41C_2$, and the fifth connector side face $41C_5$ of the first connector 41. Thus, the molded article 30 supports the corner portions of the flat first connector 41 in the first, second, and third directions. The molded article 30 also is in contact with the second support plate side face $43C_2$ of the support plate 432. The molded article 30 is thus connected to the support plate 432.

Also, the molded article 30 is in contact with the first terminal part side face $42C_1$ and the second terminal part end face $42C_2$ of the first terminal part 42. Thus, the molded article 30 is connected to the first terminal part 42 from the first terminal part side face $42C_1$ of the first terminal part 42 all the way to the second terminal part end face $42C_2$.

The molded article 30 also is in contact with the second rear face 51B, the first connector side face $51C_1$, and the second connector side face $51C_2$ of the second connector 51. Thus, the molded article 30 supports the corner portions of the flat second connector 51 in the first, second, and third directions. The molded article 30 also is in contact with the first terminal part side face $52C_1$ of the second terminal part 52. The molded article 30 is thus connected to the second terminal part 52.

Similarly, the molded article 30 is in contact with the second rear face 51B, the third connector side face $51C_3$, and the fourth connector side face $51C_4$ of the second connector 51. Thus, the supports the corner portions of the flat second connector 51 in the first, second, and third directions.

Also, the molded article 30 is in contact with the second rear face 51B, the fourth connector side face $51C_4$, and the fifth connector side face $51C_5$ of the second connector 51. Thus, the molded article 30 supports the corner portions of the flat second connector 51 in the first, second, and third directions. The molded article 30 also is in contact with the second terminal part side face $52C_2$ of the second terminal part 52. The molded article 30 is thus connected to the second terminal part 52.

Also, the molded article 30 is in contact with the first terminal part side face $52C_1$ and the second terminal part side face $52C_2$ of the second terminal part 52. Thus, the molded article 30 is connected to the second terminal part 52 from the first terminal part side face $52C_1$ of the second terminal part 52 all the way to the second terminal part side face $52C_2$.

Figure 7:
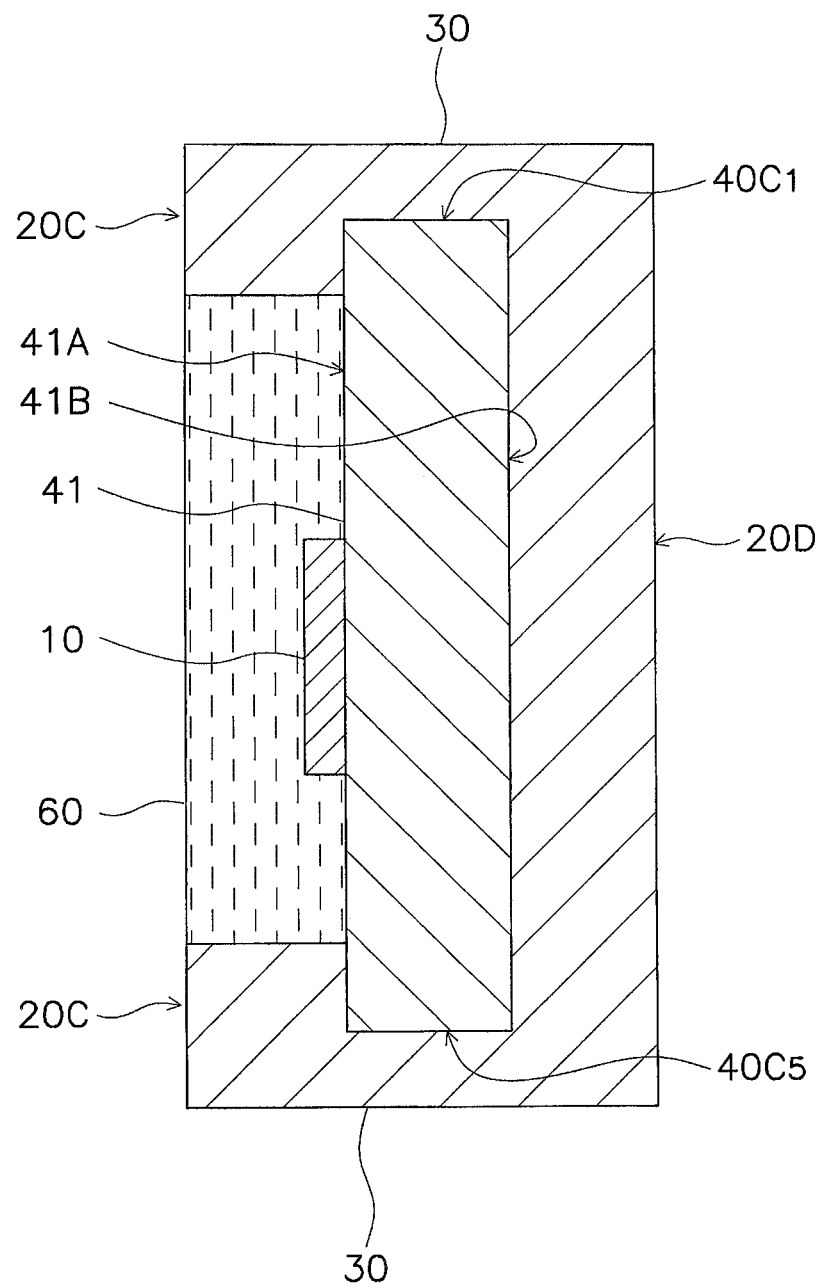
FIG. 7 is a cross section along the B-B line in FIG. 5.
Figure 8:
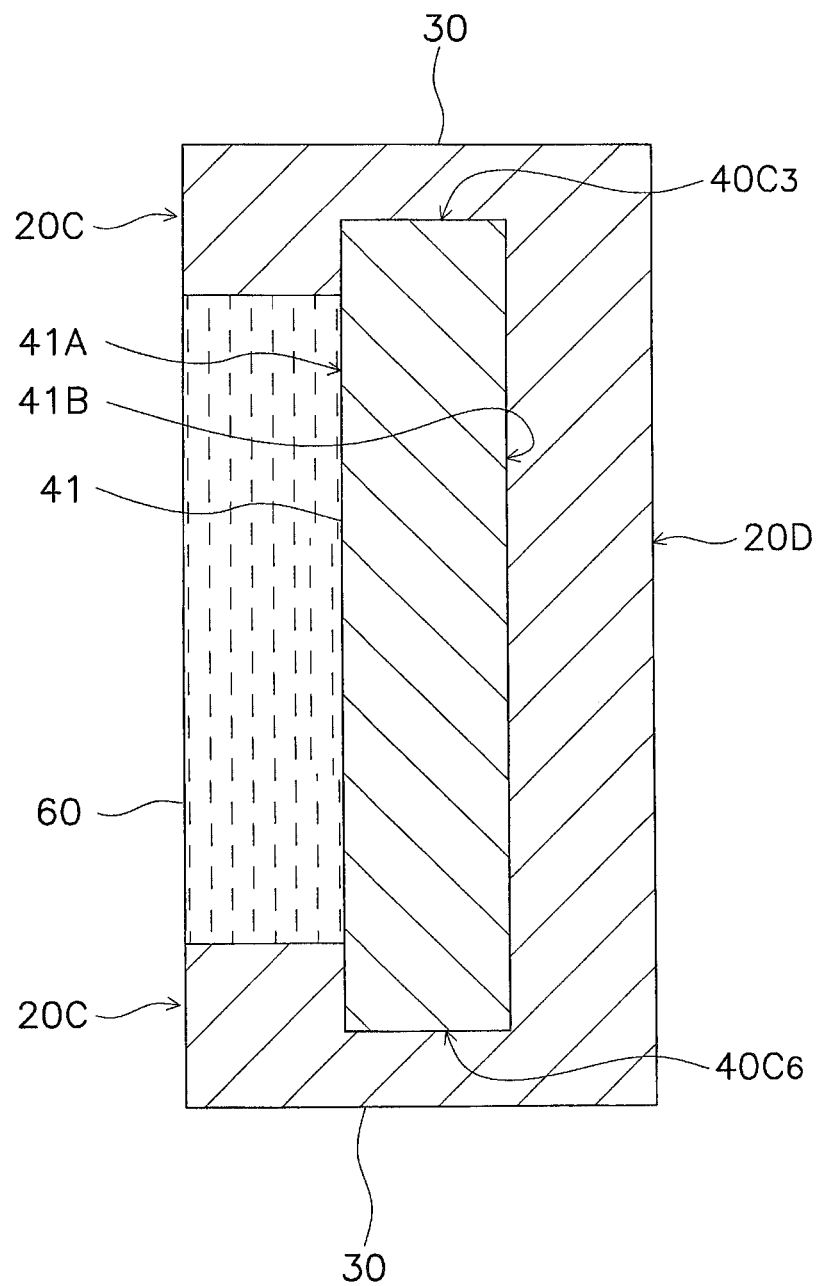
FIG. 8 is a cross section along the C-C line in FIG. 5.
Figure 9:
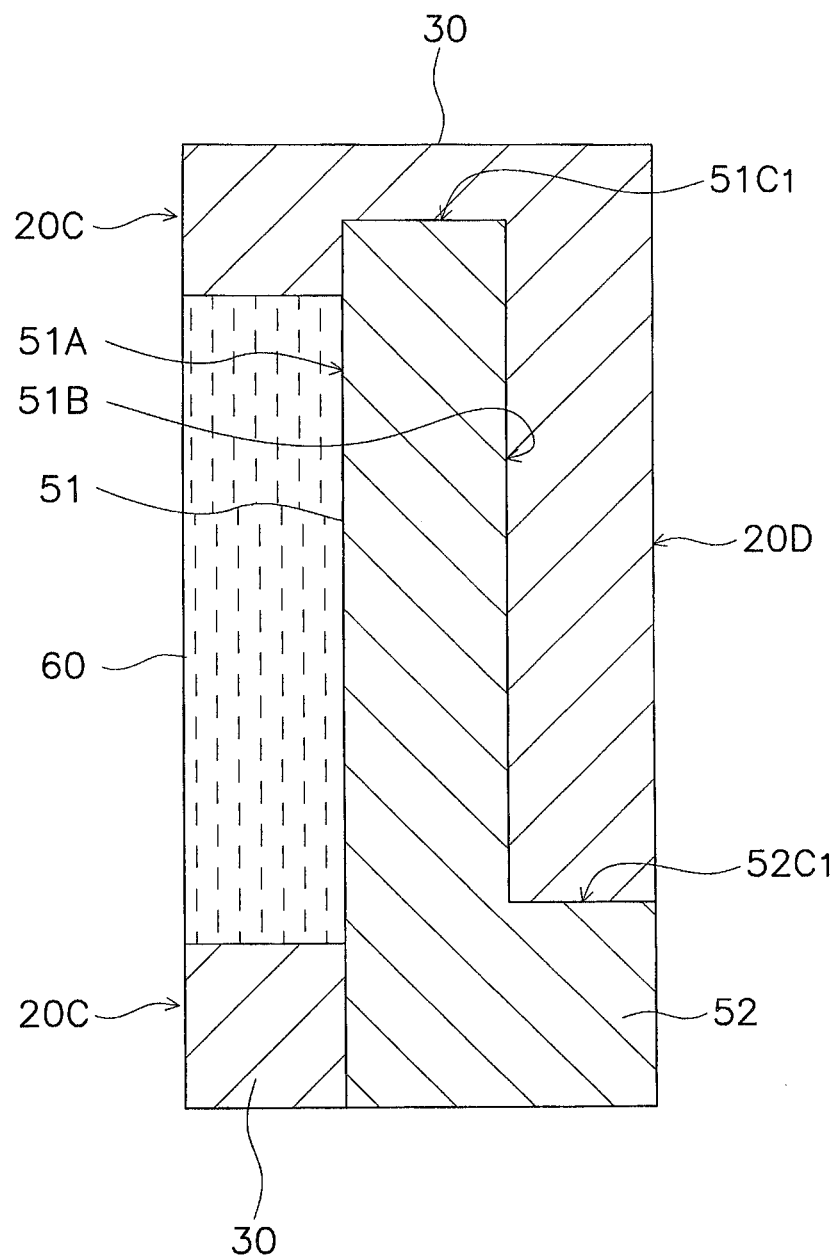
FIG. 9 is a cross section along the D-D line in FIG. 5.
Figure 10:
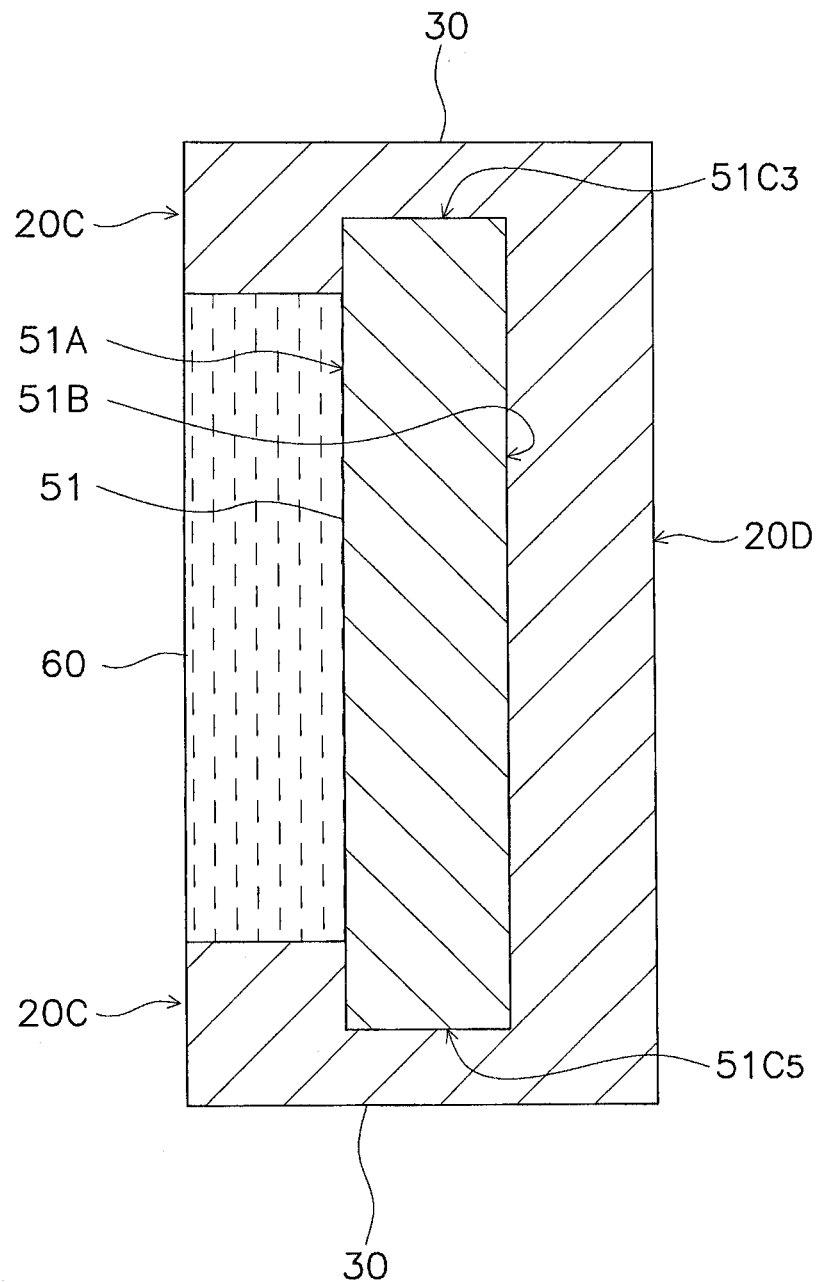
FIG. 10 is a cross section along the E-E line in FIG. 5.

Next, the grasping of the first lead 40 and the second lead 50 by the molded article 30 will be described through reference to cross sections. FIG. 7 is a cross section along the B-B line in FIG. 5. FIG. 8 is a cross section along the C-C line in FIG. 5. FIG. 9 is a cross section along the D-D line in FIG. 5. FIG. 10 is a cross section along the E-E line in FIG. 5.

As shown in FIG. 7, the molded article 30 is in continuous contact with the first connector side face $41C_1$, the first rear face 41B, and the fifth connector side face $41C_5$ of the first connector 41. Consequently, the molded article 30 grasps the first connector 41. Also, the molded article 30 is in continuous contact with the first connection face 41A, the first connector side face $41C_1$, and the first rear face 41B of the first connector 41. The molded article 30 thus grasps the outer edge of the first connector 41. Similarly, the molded article 30 is in continuous contact with the first connection face 41A, the fifth connector side face $41C_5$, and the first rear face 41B of the first connector 41. The molded article 30 thus grasps the outer edge of the first connector 41.

Similarly, as shown in FIG. 8, the molded article 30 is in continuous contact with the third connector side face $41C_3$, the first rear face 41B, and the sixth connector side face $41C_6$ of the first connector 41. Consequently, the molded article 30 grasps the first connector 41. Also, the molded article 30 is in continuous contact with the first connection face 41A, the third connector side face $41C_3$, and the first rear face 41B of the first connector 41. The molded article 30 thus grasps the outer edge of the first connector 41. Similarly, the molded article 30 is in continuous contact with the first connection face 41A, the sixth connector side face $41C_6$, and the first rear face 41B of the first connector 41. The molded article 30 thus grasps the outer edge of the first connector 41.

Also, as shown in FIG. 9, the molded article 30 is in continuous contact with the second connection face 51A, the first connector side face $51C_1$, and the second rear face 51B of the second connector 51. Thus, the molded article 30 grasps the outer edge of the second connector 51. Also, the molded article 30 is in contact with the first terminal part side face $52C_1$ of the second terminal part 52. The molded article 30 is thus connected to the second terminal part 52.

Similarly, as shown in FIG. 10, the molded article 30 is in continuous contact with the third connector side face $51C_3$, the second rear face 51B, and the fifth connector side face $51C_5$ of the second connector 51. The molded article 30 thus grasps the second connector 51. Also, the molded article 30 is in continuous contact with the second connection face 51A, the third connector side face $51C_3$, and the second rear face 51B of the second connector 51. The molded article 30 thus grasps the outer edge of the second connector 51. Similarly, the molded article 30 is in continuous contact with the second connection face 51A, the fifth connector side face $51C_5$, and the second rear face 51B of the second connector 51. Thus, the molded article 30 grasps the outer edge of the second connector 51.

Method for Manufacturing Light Emitting Devices

Figure 11A:
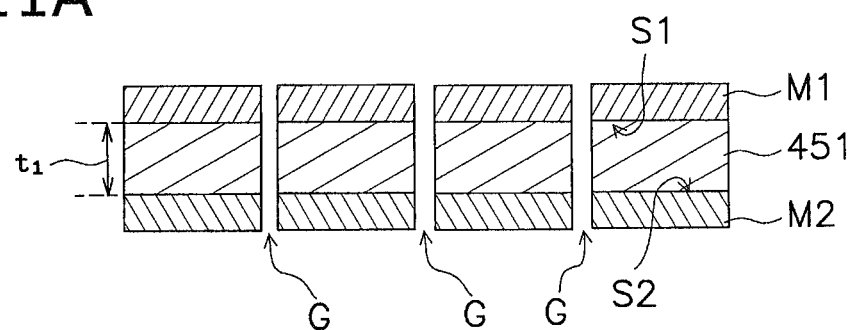
FIG. 11 is a diagram illustrating a method for manufacturing the light emitting device 100 pertaining to the first embodiment.
Figure 11B:
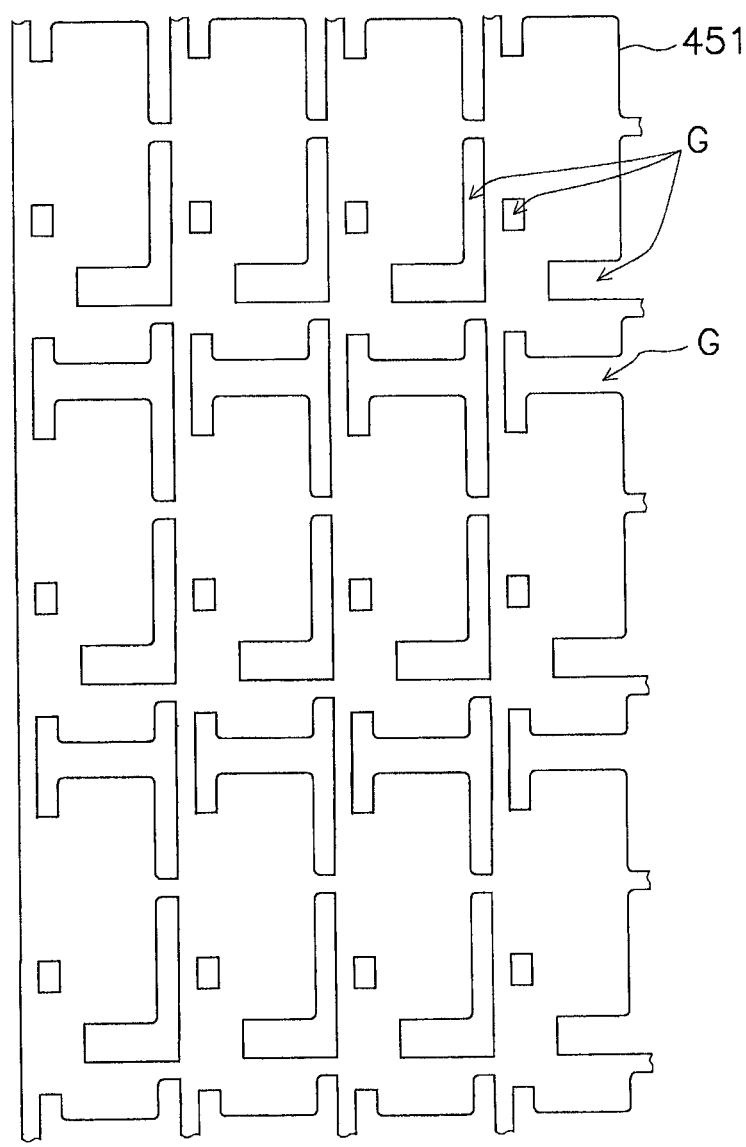
Figure 12A:
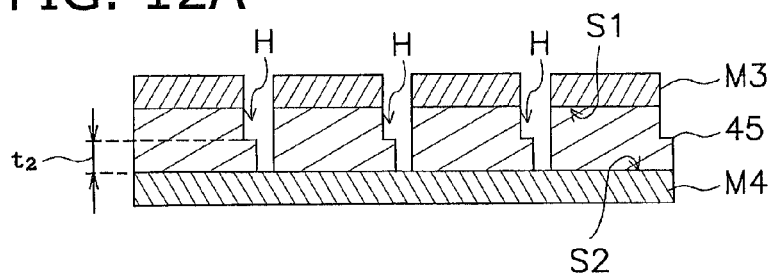
FIG. 12 is a diagram illustrating a method for manufacturing the light emitting device 100 pertaining to the first embodiment.
Figure 12B:
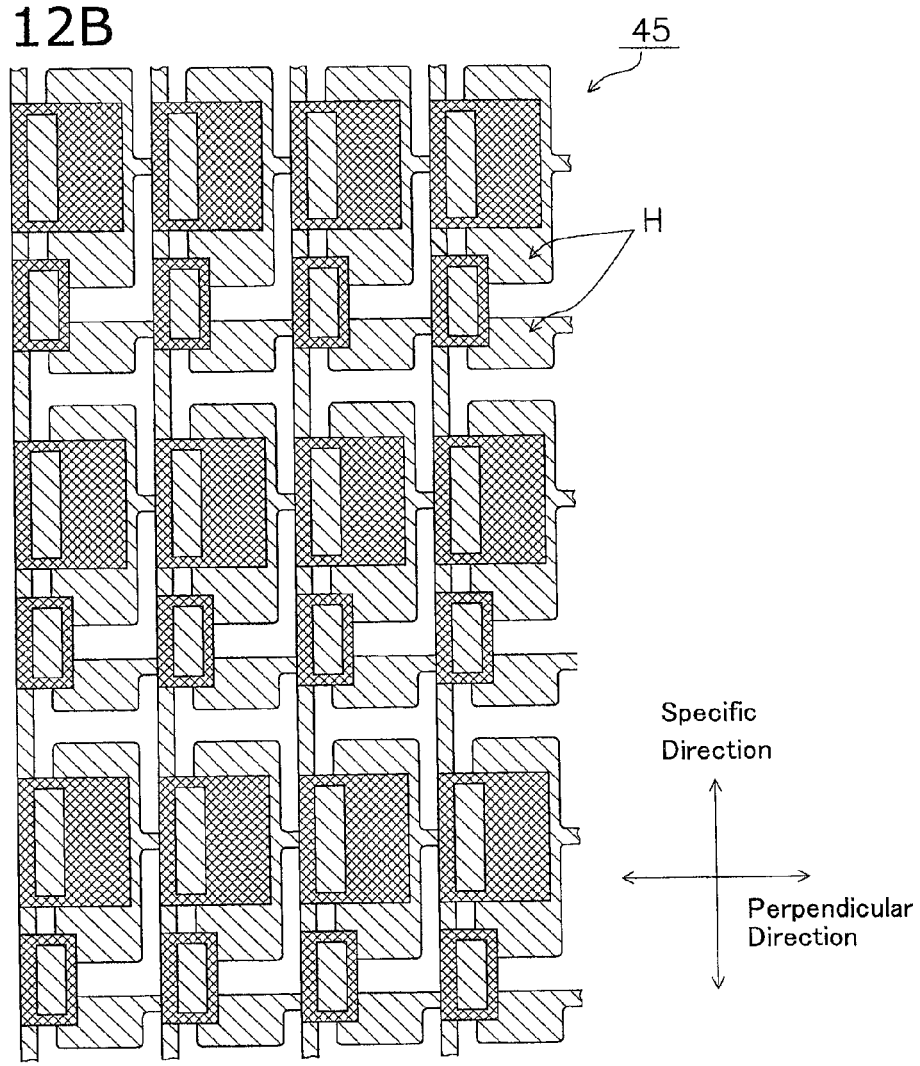
Figure 13:
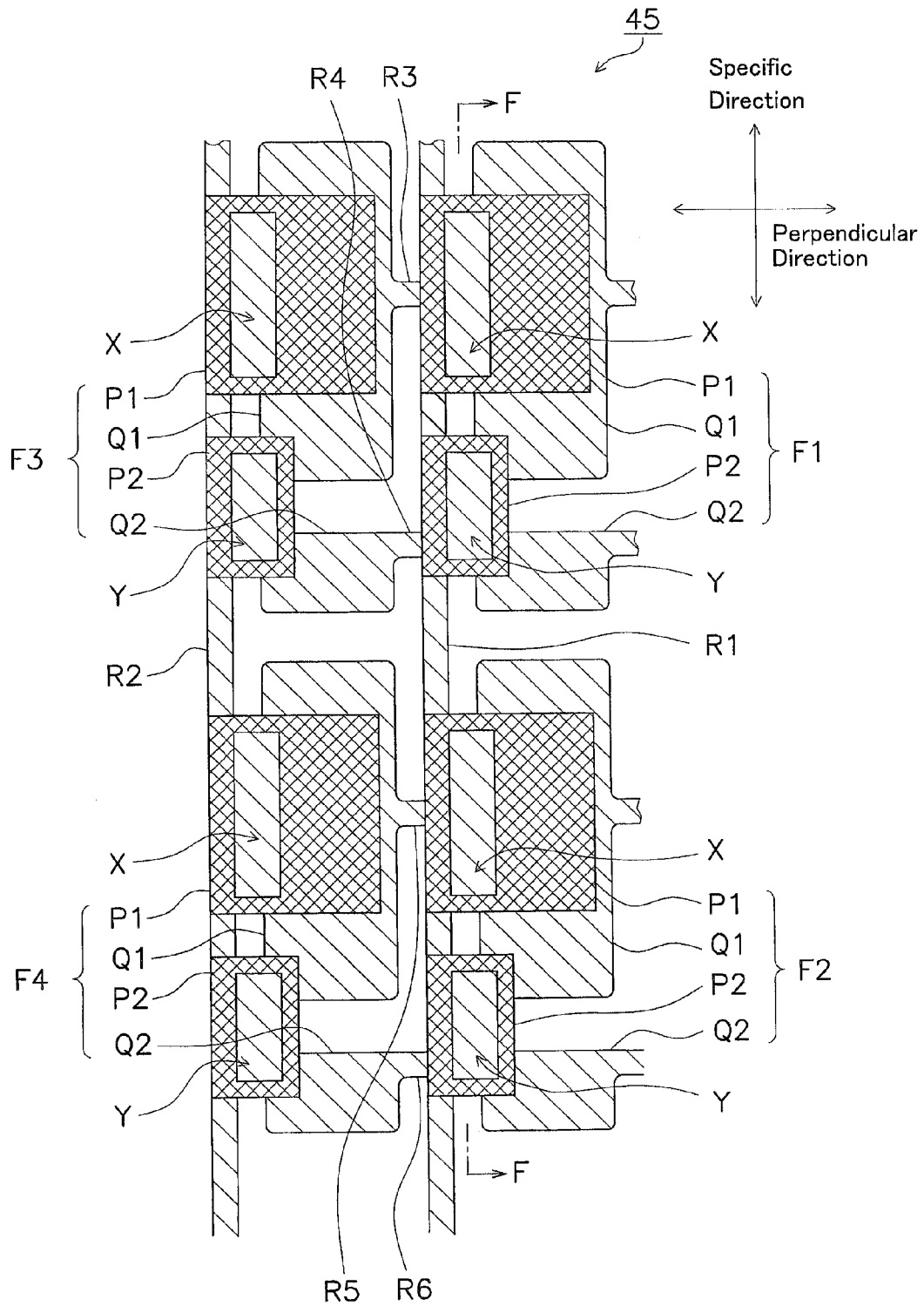
FIG. 13 is a detail view of a lead frame 45 pertaining to the first embodiment.
Figure 14:
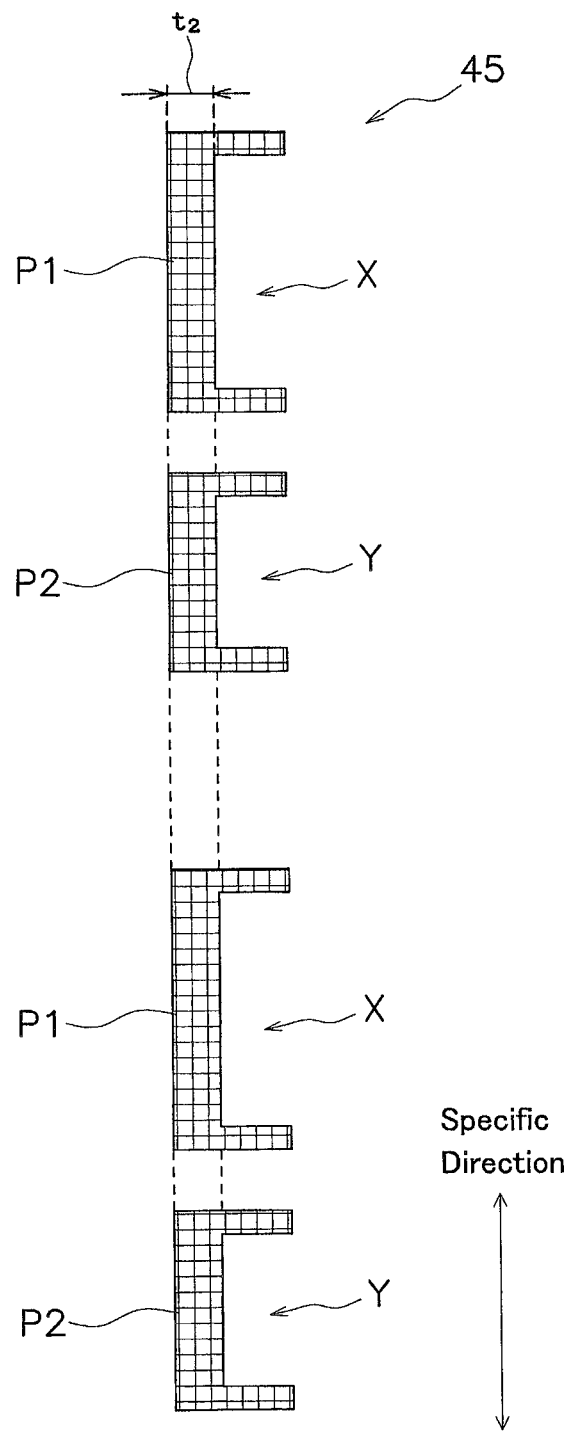
FIG. 14 is a cross section along the F-F line in FIG. 13.
Figure 15:
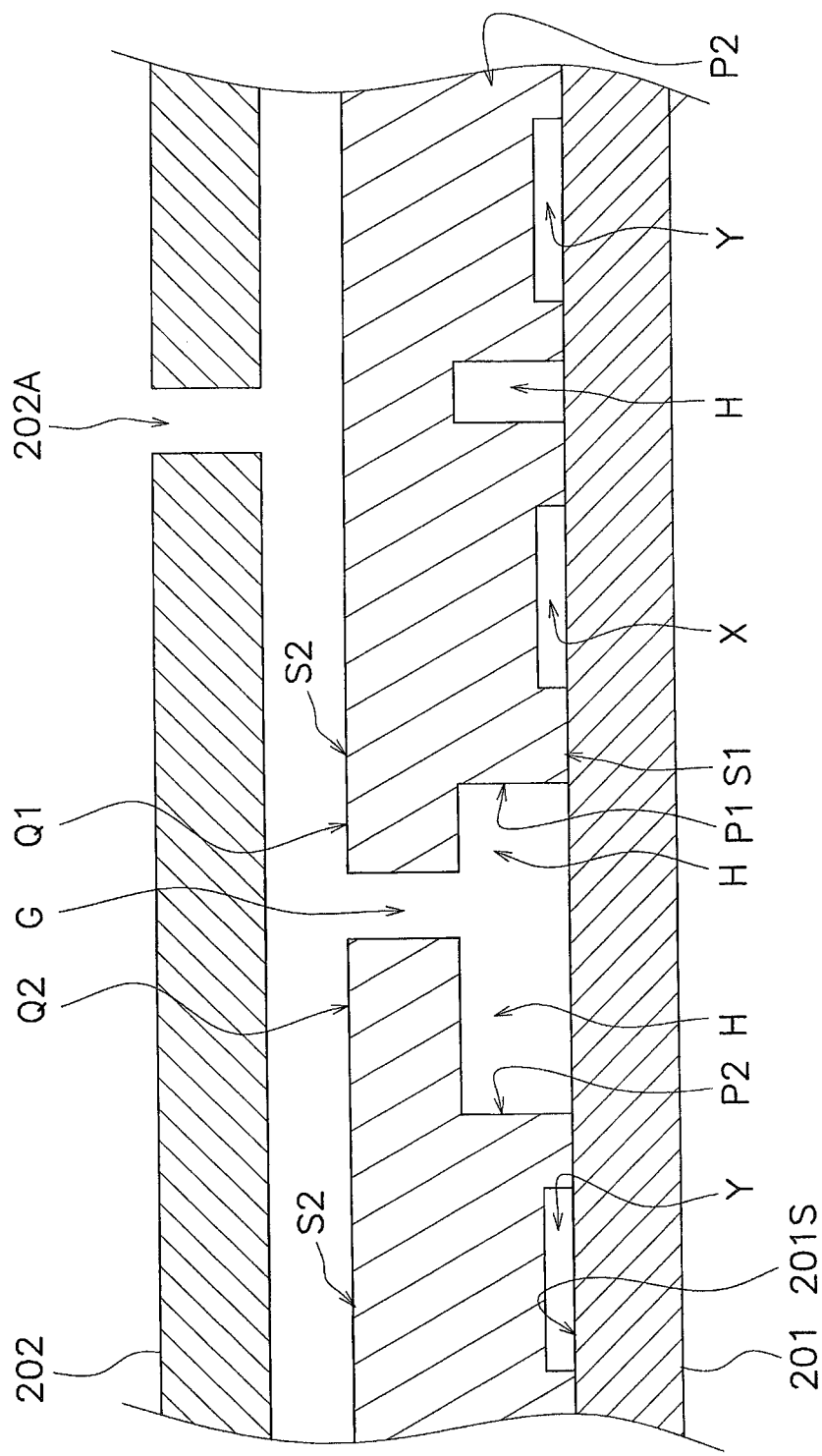
FIG. 15 is a diagram illustrating a method for manufacturing the light emitting device 100 pertaining to the first embodiment.

A method for manufacturing a plurality of the light emitting devices 100 pertaining to the first embodiment all at once will be described through reference to the drawings. FIG. 11A is a cross section of a thin metal plate 451, and FIG. 11B is a plan view of the thin metal plate 451. FIG. 12A is a cross section of a lead frame 45, and FIG. 12B is a plan view of the lead frame 45. FIG. 13 is a detail view of the lead frame 45. FIG. 14 is a cross section along the F-F line in FIG. 13. FIG. 15 is a plan view of a light emitting device package array PA pertaining to this embodiment.

First, the thin metal plate 451 is readied, which has a first main face S1 and a second main face S2 provided opposite the first main face S1. In this embodiment, the thin metal plate 451 has a thickness $t_1$ (such as about 0.5 mm).

Next, as shown in FIG. 11A, a first mask M1 is formed in a specific pattern over the first main face S1, and a second mask M2 is formed in a symmetrical pattern to the first mask M1 over the second main face S2, and the first main face S1 and the second main face S2 are etched at the same time. Consequently, as shown in FIG. 11B, etching holes G are formed in the thin metal plate 451. This etching can be accomplished by dry or wet etching. An etchant that is suitable for the material of the thin metal plate 451 should be selected.

Next, as shown in FIG. 12A, a third mask M3 is formed in a specific pattern over the first main face S1, and a fourth mask M4 is formed over the second main face S2 so as to cover the entire second main face S2, and only the first main face S1 is etched. As shown in FIG. 12B, this completes the lead frame 45, which has etching concavities H formed in the first main face S1. The depth of the etching concavities H is about 0.3 mm, for example. Accordingly, the portion of the thin metal plate 451 in which the etching concavities H are formed has a thickness $t_2$ (such as about 0.2 mm) that is less than the thickness $t_1$.

The configuration of the lead frame 45 formed in this manner will be described in detail through reference to the drawings. As shown in FIG. 13, the lead frame 45 has a first frame part F1, a second frame part F2, a third frame part F3, and a fourth frame part F4.

The first frame part F1 and the second frame part F2 are adjacent to each other in a specific direction, and are linked by a first linking frame R1. The third frame part F3 and the fourth frame part F4 are adjacent to each other in a specific direction, and are linked by a second linking frame R2. The first frame part F1 and the third frame part F3 are adjacent to each other in a perpendicular direction, which is perpendicular to a specific direction (an example of a perpendicular direction), and are linked by a third linking frame R3 and a fourth linking frame R4. The second frame part F2 and the fourth frame part F4 are adjacent to each other in a perpendicular direction, and are linked by a fifth linking frame R5 and a sixth linking frame R6.

The first to fourth frame parts F1 to F4 each have the same configuration, and include a first thick part P1, a second thick part P2, a first thin part Q1, and a second thin part Q2.

The first thick part P1 has a first thickness $t_1$ (that is, the thickness of the thin metal plate 451). In a later step, the first thick part P1 is cut with a dicing saw to form the base part 43. The second thick part P2 has the first thickness $t_1$. The second thick part P2 is isolated from the first thick part P1 in a specific direction. In a later step, the second thick part P2 is cut with a dicing saw to form the first terminal part 42 and the second terminal part 52.

The first thin part Q1 has a second thickness $t_2$ (that is, the thickness of the portion of the thin metal plate 451 where the etching concavities H are formed). The first thin part Q1 is linked to the first thick part P1 and the second thick part P2. The first thin part Q1 corresponds to an outer periphery of the mounting part 41 of the light emitting device 100. The second thin part Q2 has the second thickness $t_2$ (that is, the thickness of the portion of the thin metal plate 451 where the etching concavities H are formed). The second thin part Q2 is linked to the first thick part P1, and is isolated from the first thin part Q1 via the etching holes G in a specific direction (see FIG. 11). The second thin part Q2 corresponds to the connector 51 of the light emitting device 100.

In this embodiment, in a plan view of the lead frame 45, a one-sided etching concavity X, which is a part of the etching concavity H, is formed on the inside of the first thick part P1 of each of the frame parts F. As shown in FIG. 14, the portion of the first thick part P1 where the one-sided etching concavities X are formed has the second thickness $t_2$. In a later step, the one-sided etching concavities X are cut with a dicing saw to form the concavity 43S (see FIG. 4).

Similarly, in this embodiment, in a plan view of the lead frame 45D, a one-sided etching concavity Y, which is a part of the etching concavity H, is formed on the inside of the second thick part P2 of each of the frame parts F. As shown in FIG. 14, the portion of the second thick part P2 where the one-sided etching concavities Y are formed has the second thickness $t_2$. In a later step, the one-sided etching concavities Y are cut with a dicing saw to form the first terminal concavity 42S and the second terminal concavity 52S (see FIG. 4).

In this embodiment, the first thin part Q1 of the third frame part F3 is linked via the third linking frame R3 to the first thick part P1 of the first frame part F1. The second thin part Q2 of the third frame part F3 is linked via the fourth linking frame R4 to the second thick part P2 of the first frame part F1. Similarly, the first thin part Q1 of the fourth frame part F4 is linked via the fifth linking frame R5 to the first thick part P1 of the second frame part F2. The second thin part Q2 of the fourth frame part F4 is linked via the sixth linking frame R6 to the second thick part P2 of the second frame part F2.

The first to sixth linking frames R1 to R6 are cut with a dicing saw in a later step (see FIG. 16). That is, the first to sixth linking frames R1 to R6 are cutting allowance for dicing. The fifth and sixth linking frames R5 and R6 are cut to form the first exposed part 44 and the second exposed part 54. As shown in FIG. 13, the portion of the first thick part P1 that is linked to the third linking frame R3, and the portion of the second thick part P2 that is linked to the fourth linking frame R4 are disposed in a specific direction, and are cutting allowance for dicing as the first to sixth linking frames R1 to R6.

Next, as shown in FIG. 15, the lead frame 45 is placed between the lower mold 201 and the upper mold 202. The resulting state is one in which the first main face S1 of the lead frame 45 is butted against the inner face 201S of the lower mold 201.

Then, a resin material is injected through the injection port 202A of the upper mold 202 into the mold (between the lower mold 201 and the upper mold 202). This causes the resin material to move from the second main face S2 side to the first main face S1 side. More specifically, the resin material spreads out over the second main face S2, goes through the etching hole G, and fills the etching concavity H.

Next, the resin material is transfer molded by being heated at a specific temperature. As shown in FIG. 16, this completes a light emitting device package array PA made up of the lead frame 45 and a molded board 46 in which the lead frame 45 is embedded. Care should be taken with the light emitting device package array PA so that the first thick part P1 and the one-sided etching concavities X, and the second thick part P2 and the one-sided etching concavities Y, are exposed from the molded board 46.

Figure 16:
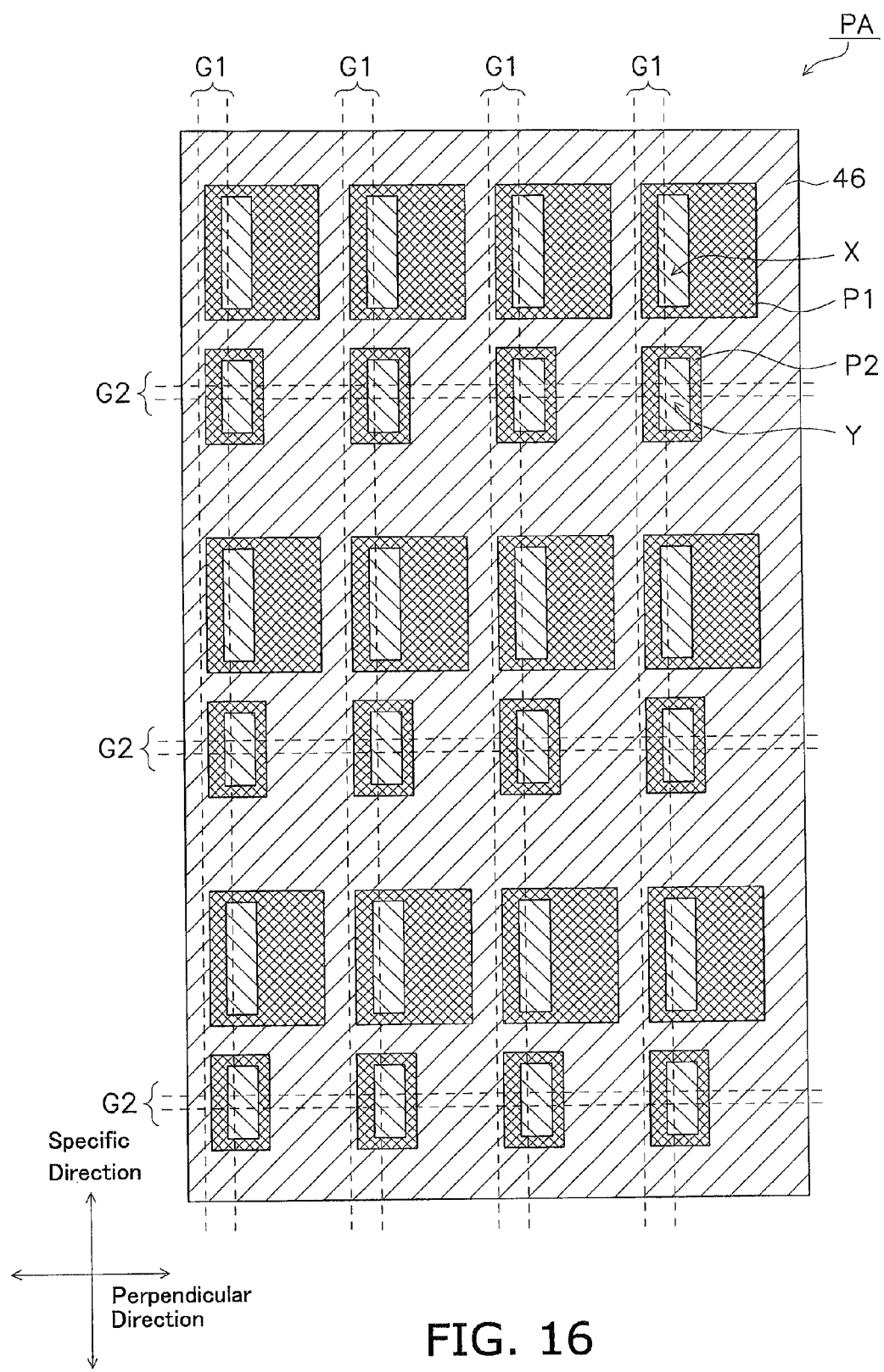
FIG. 16 is a diagram illustrating a method for manufacturing the light emitting device 100 pertaining to the first embodiment.

Then, as shown in FIG. 16, a dicing saw is used to cut the light emitting device package array PA along cutting lines G1 and G2 of a specific width. This allows a plurality of light emitting devices 100 to be manufactured all at once.

Action and Effect (1) With the light emitting device 100 pertaining to the first embodiment, the first terminal part 42 and the exposed part 43 are exposed from the molded article 30 contiguously with the bottom face 20A and the rear face 20D, and is isolated at the bottom face 20A.

Therefore, part of the molded article 30 can be sandwiched between the first terminal part 42 and the exposed part 43. Accordingly, part of the molded article 30 can be brought into contact with the sixth connector side face $51C_6$ of the first connector 41, the second terminal part end face $42C_2$ of the first terminal part 42, and the third support plate side face $43C_3$ of the exposed part 43. Therefore, the contact surface area between the molded article 30 and the first lead 40 can be increased, and adhesion between the molded article 30 and the first lead 40 can be improved.

(2) With the light emitting device 100 pertaining to the first embodiment, the molded article 30 is in contact with the first rear face 41B, the first connector side face $41C_1$, and the second connector side face $41C_2$ of the first connector 41, and is also in contact with the first support plate side face $43C_1$ of the support plate 432.

Therefore, the corner portions of the first connector 41 can be supported by the molded article 30 in the first, second, and third directions, so separation of the molded article 30 from the first lead 40 can be suppressed. Also, since the molded article 30 is in contact with the first support plate side face $43C_1$, the contact surface area between the molded article 30 and the first lead 40 can be increased. As a result, adhesion between the molded article 30 and the first lead 40 can be improved.

This effect is similarly obtained with the following configurations.

(i) The molded article 30 is in contact with the first rear face 41B, the third connector side face $41C_3$, and the fourth connector side face $41C_4$ of the first connector 41, and also is in contact with the first support plate side face $43C_1$ of the support plate 432.

(ii) The molded article 30 is in contact with the first rear face 41B, the second connector side face $41C_2$, and the fifth connector side face $41C_5$ of the first connector 41, and also is in contact with the second support plate side face $43C_2$ of the support plate 432.

Also, with the light emitting device 100 pertaining to this embodiment, the molded article 30 is in contact with the second rear face 51B, the first connector side face $51C_1$, and the second connector side face $51C_2$ of the second connector 51.

Therefore, the corner portions of the second connector 51 can be supported by the molded article 30 in the first, second, and third directions, so separation of the molded article 30 from the second lead 50 can be suppressed. Also, since the molded article 30 is in contact with the first terminal part side face $52C_1$, the contact surface area between the molded article 30 and the second lead 50 can be increased. As a result, adhesion between the molded article 30 and the second lead 50 can be improved.

This effect is similarly obtained by having the molded article 30 be in contact with the second rear face 51B, the fourth connector side face $51C_4$, and the fifth connector side face $51C_5$ of the second connector 51, and having it also be in contact with the second terminal part side face $52C_2$ of the second terminal part 52.

(3) With the light emitting device 100 pertaining to the first embodiment, the molded article 30 is in continuous contact with the first connector side face $41C_1$, the first rear face 41B, and the fifth connector side face $41C_5$ of the first connector 41. Consequently, the first connector 41 can be grasped by the molded article 30, so separation of the molded article 30 from the first lead 40 can be suppressed.

This effect is similarly obtained by having the molded article 30 be in continuous contact with the third connector side face $41C_3$, the first rear face 41B, and the sixth connector side face $41C_6$ of the first connector 41.

(4) With the light emitting device 100 pertaining to the first embodiment, the molded article 30 is in continuous contact with the first connection face 41A, the first connector side face $41C_1$, and the first rear face 41B of the first connector 41. Consequently, the outer edge of the first connector 41 can be grasped by the molded article 30, so separation of the molded article 30 from the first lead 40 can be suppressed.

This effect is similarly obtained with the following configurations.

(i) The molded article 30 is in continuous contact with the first connection face 41A, the fifth connector side face $41C_5$, and the first rear face 41B of the first connector 41.

(ii) The molded article 30 is in continuous contact with the first connection face 41A, the third connector side face $41C_3$, and the first rear face 41B.

(iii) The molded article 30 is in continuous contact with the first connection face 41A, the sixth connector side face 41C$_6$, and the first rear face 41B.

Also, with the light emitting device 100 pertaining to this embodiment, the molded article 30 is in continuous contact with the second connection face 51A, the first connector side face 51C$_1$, and the second rear face 51B of the second connector 51. Consequently, the outer edge of the second connector 51 can be grasped by the molded article 30, so separation of the molded article 30 from the second lead 50 can be suppressed.

This effect is similarly obtained with the following configurations.

(i) The molded article 30 is in continuous contact with the second connection face 51A, the third connector side face 51C$_3$, and the second rear face 51B of the second connector 51.

(ii) The molded article 30 is in continuous contact with the second connection face 51A, the fifth connector side face 51C$_5$, and the second rear face 51B of the second connector 51.

(5) With the light emitting device 100 pertaining to the first embodiment, the first lead 40 has the first terminal part 42 and the first terminal concavity 42S formed in the first terminal part 42.

This first terminal part 42 functions particularly effectively in a side view type of light emitting device 100 that has been markedly reduced in size. Specifically, the first terminal concavity 42S is filled by a solder fillet provided to the first terminal part 42 when the light emitting device 100 is mounted. Accordingly, the contact surface area between the first terminal part 42 and the solder fillet can be increased, so electrical resistance can be reduced between the compact light emitting device 100 and the mounting board (not shown).

With this compact light emitting device 100, the contact surface area between the molded article 30 and the first and second leads 40 and 50 ends up being extremely small. Therefore, the action and effect discussed in (1) to (3) above are particularly pronounced with the side view type of light emitting device 100 pertaining to this embodiment.

(6) With the light emitting device 100 pertaining to the first embodiment, the first lead 40 has the exposed part 43 that is exposed from the molded article 30 at the rear face 20D. Since this exposed part 43 functions as a heat sink, the heat dissipation of the light emitting device 100 can be improved.

(7) With the light emitting device 100 pertaining to the first embodiment, the first connection face 41A is exposed in the interior of the front face opening 20F, and the sealing resin 60 is in contact with the first connection face 41A.

Therefore, the first connection face 41A can be held down by the sealing resin 60, so the first connector 41 can by affixed more securely by the molded article 30. As a result, adhesion between the molded article 30 and the molded article 30 can be improved. This effect is also obtained when the sealing resin 60 comes into contact with the second connection face 51A.

Second Embodiment

Next, a second embodiment will be described through reference to the drawings. The difference between the first and second embodiments is that the light emitting device 100 comprises three terminal parts. The following description will focus on this difference.

Configuration of Light Emitting Device

Figure 17:
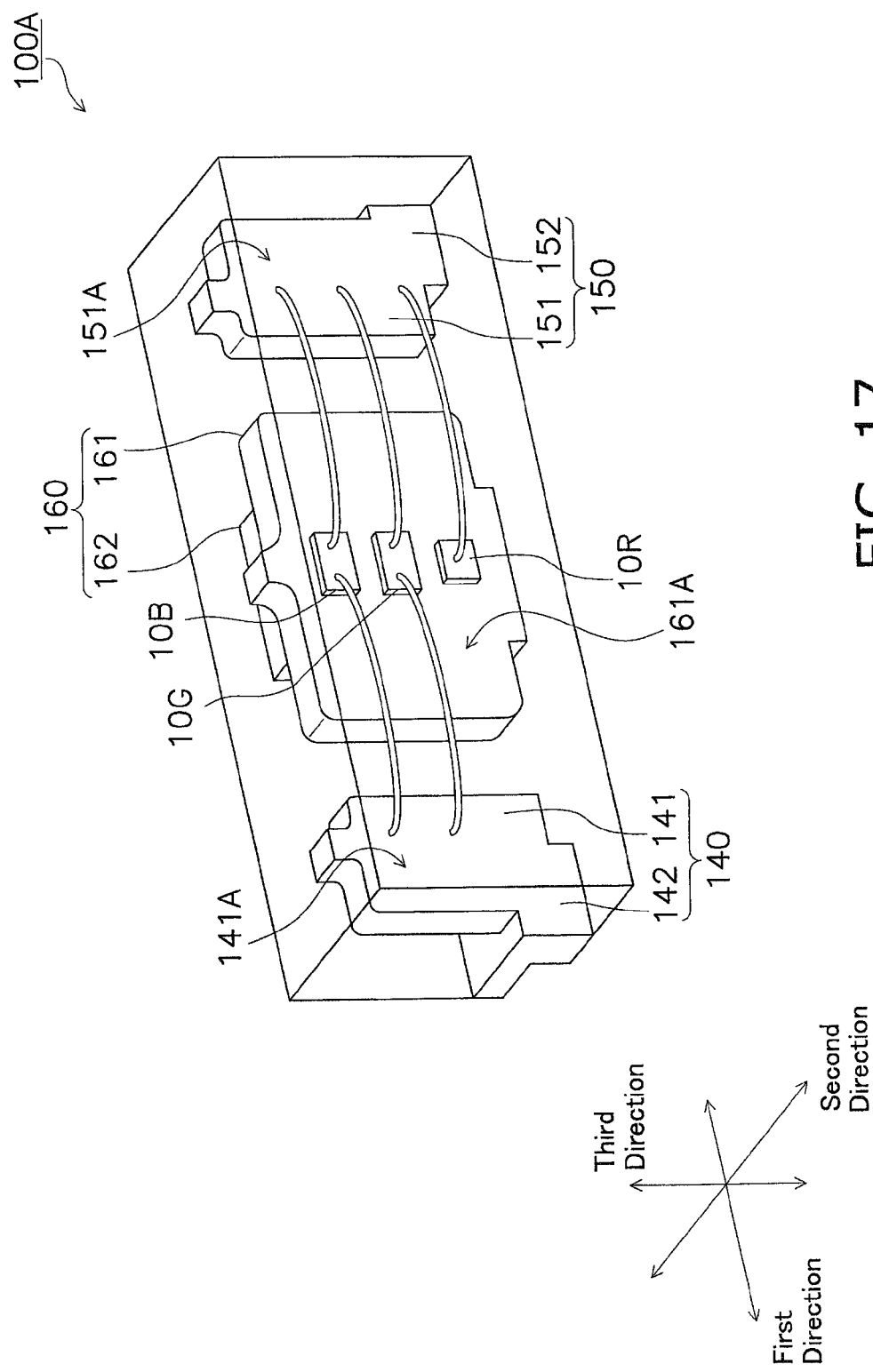
FIG. 17 is an oblique see-through view of a light emitting device 100 pertaining to a second embodiment, as seen from the front.
Figure 18:
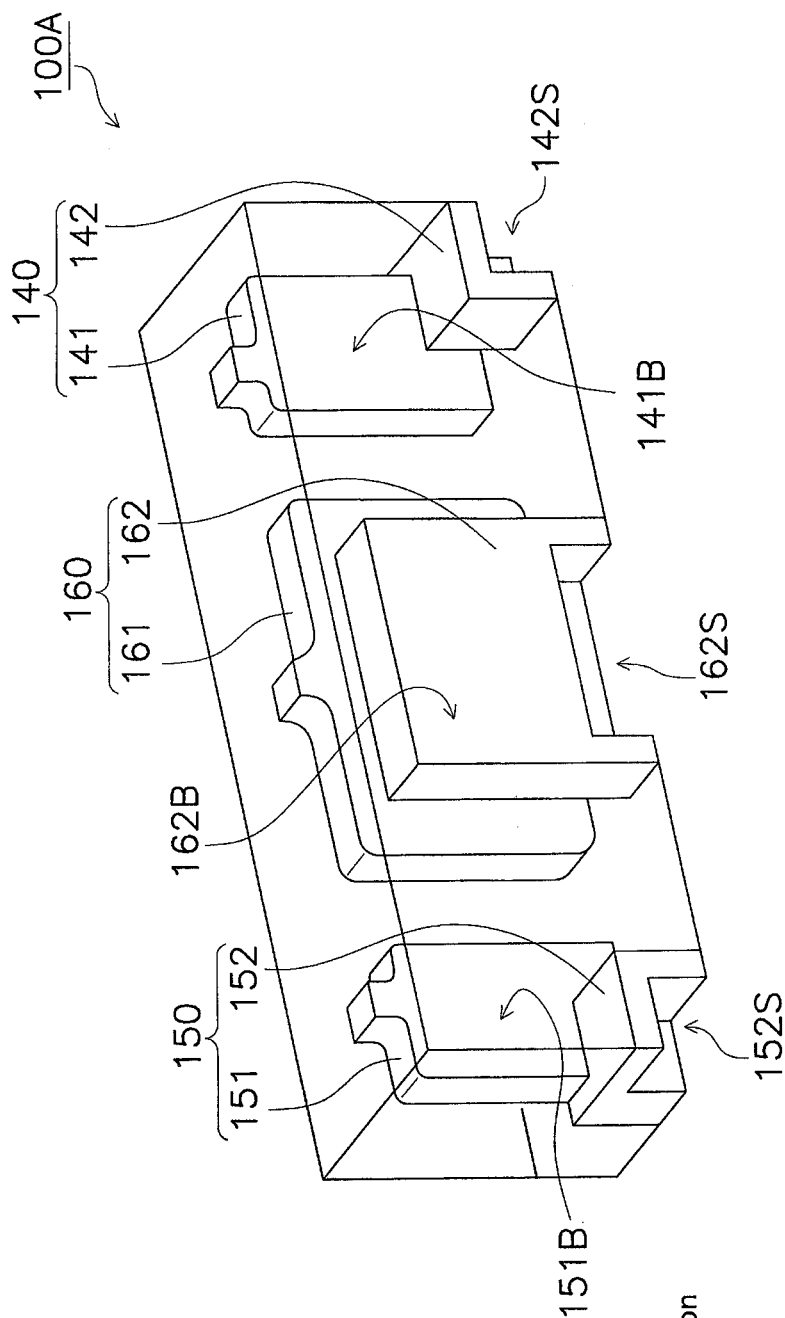
FIG. 18 is an oblique see-through view of the light emitting device 100 pertaining to the second embodiment, as seen from the rear.
Figure 18:
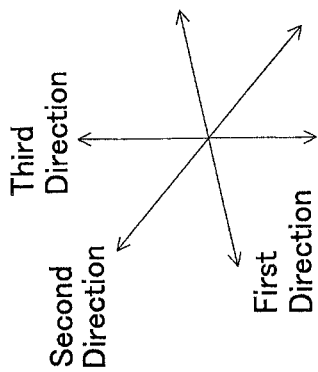

FIG. 17 is an oblique see-through view of a light emitting device 100 pertaining to the second embodiment, as seen from the front. FIG. 18 is an oblique see-through view of the light emitting device 100 pertaining to the second embodiment, as seen from the rear.

As shown in FIGS. 17 and 18, the light emitting device 100 comprises a first lead 140, a second lead 150, a third lead 160, a blue light emitting element 10B, a green light emitting element 10G, and a red light emitting element 10R.

The first lead 140 has a first connector 141 (an example of a "first connector") and a first terminal part 142. The second lead 150 has a second connector 151 (an example of a "second connector") and a second terminal part 152. The third lead 160 has a mounting part 161 and an exposed part 162. The first terminal part 142, the second terminal part 152, and the exposed part 162 are each electrically connected to a mounting board (not shown), and thereby function as external terminals.

The blue light emitting element 10B, the green light emitting element 10G and the red light emitting element 10R are placed on a placement face 161A of the mounting part 161. The blue light emitting element 10B and the green light emitting element 10G are electrically connected to a first connection face 141A of the first connector 141 and a second connection face 151A of the second connector 151. The red light emitting element 10R is electrically connected to the second connection face 151A and the third connection face 161A.

The molded article 30 here comes into contact with the two side faces of the first connector 141, and also comes into contact with one side face of the first terminal part 142. The molded article 30 comes into contact with the two side faces of the second connector 151, and also comes into contact with one side face of the second terminal part 152. The molded article 30 also comes into contact with the two side faces of the mounting part 161, and comes into contact with one side face of the exposed part 162.

Action and Effect

With the light emitting device 100A pertaining to the second embodiment, the molded article 30 is in contact with two side faces of the first connector 141, and is in contact with one side face of the first terminal part 142.

Since the molded article 30 is thus in contact with two side faces of the first connector 141, the corner portions of the first connector 141 are supported by the molded article 30 in the first, second, and third directions. Also, since the molded article 30 is in contact with one side face of the first terminal part 142, the contact surface area between the molded article 30 and the first lead 40 can be increased. This improves adhesion between the molded article 30 and the first lead 40.

For the same reason, adhesion can also be improved between the molded article 30 and the second lead 50 and the exposed part 162.

Third Embodiment

Next, a third embodiment will be described through reference to the drawings. The difference between the first and third embodiments is that a part of the second lead 50 extends toward the rear face 20D. The following description will focus on this difference.

Configuration of Light Emitting Device

Figure 19:
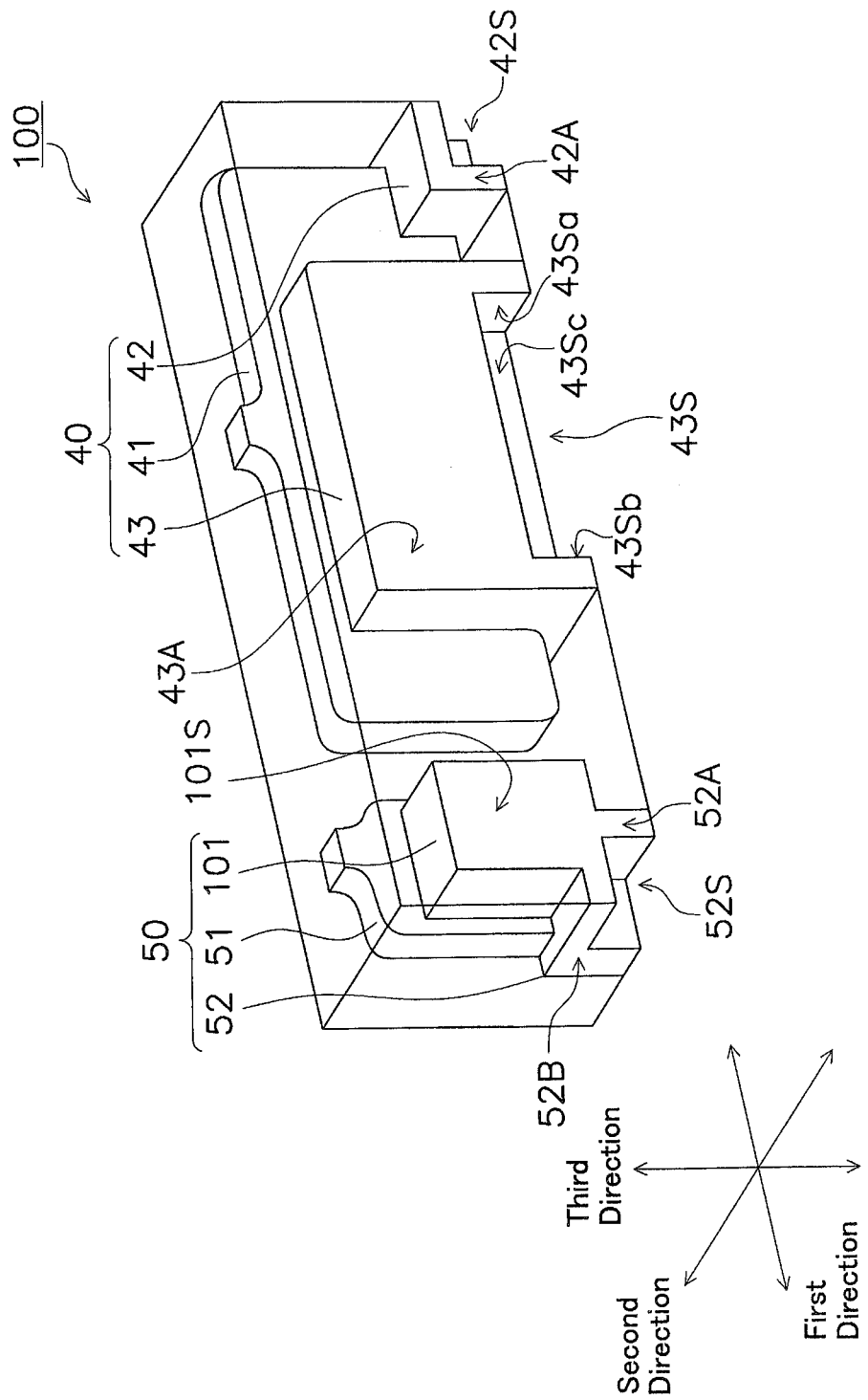
FIG. 19 is an oblique see-through view of a light emitting device 100 pertaining to a third embodiment, as seen from the rear.

FIG. 19 is an oblique see-through view of a light emitting device 100 pertaining to a third embodiment, as seen from the rear. As shown in FIG. 19, with the light emitting device 100, the second lead 50 has a first extension 101 (an example of "extension").

The first extension 101 is disposed on the second rear face 51B of the second connector 51, and is connected to the second terminal part 52. The first extension 101 extends from the second rear face 51B of the second connector 51 on the rear face 20D side, toward the rear face 20D, and is exposed from the molded article 30 at the rear face 20D. The first extension 101 has a first extension face 101S that forms part of the rear face 20D.

Method for Manufacturing Light Emitting Device

Figure 20:
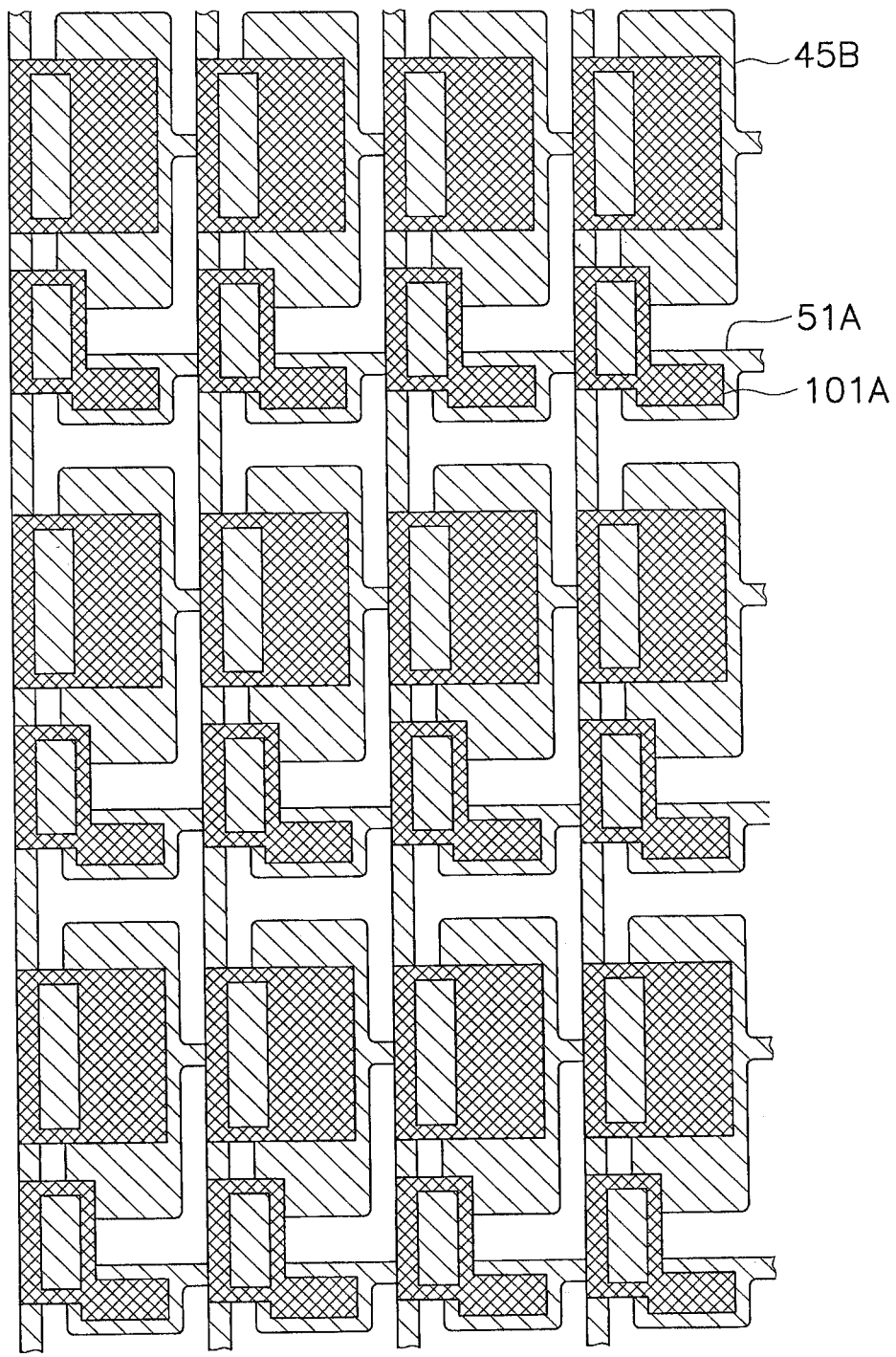
FIG. 20 is a diagram illustrating a method for manufacturing the light emitting device 100 pertaining to the third embodiment.

First, the lead frame 45A shown in FIG. 20 is readied. The lead frame 45A comprises a first extension base 101A. This lead frame 45A can be formed by setting to a C shape the region in which one-sided etching is performed to form the second connection face 51A.

Next, the lead frame 45A is embedded in the molded board 46 by transfer molding (see FIG. 16).

Next, the lead frame 45A and the molded board 46 are cut together with a dicing saw along a cutting line having a specific width (see FIG. 16).

Action and Effect

With the light emitting device 100 pertaining to the third embodiment, the second lead 50 has the first extension 101 (an example of an "extension"). The first extension 101 is disposed on the second rear face 51B of the second connector 51, and is connected to the second terminal part 52. The first extension 101 is exposed from the molded article 30 at the rear face 20D.

Thus, the first extension 101 is inserted into the molded article 30 from the second rear face 51B of the second connector 51 up to the rear face 20D. Therefore, the second lead 50 can be securely latched to the molded article 30 by the anchoring effect provided by the first extension 101.

This is especially effective when the second lead 50 is pulled in the first direction by the solder fillet. That is, when the light emitting device 100 is mounted on a mounting board, the second lead 50 is pulled in the first direction by the solidification shrinkage force of the solder fillet connected to the second terminal part 52. However, since the second lead 50 is latched to the molded article 30 at the first extension 101, it does not readily separate from the molded article 30. Accordingly, the second lead 50 can be pulled in the first direction under a greater force by the solder fillet, so the balance of the mounted light emitting device 100 can be stabilized better.

Also, since the first extension 101 is exposed from the molded article 30 at the rear face 20D, a heat dissipation path of "light emitting element 10→molded article 30 and second wire 12→second connector 51→first extension 101→first extension face 101S→outside air" can be formed. Therefore, heat generated from the light emitting element 10 can be released more efficiently from the light emitting device 100.

Also, since the first extension 101 is connected to the second terminal part 52, a heat dissipation path of "light emitting element 10→molded article 30 and second wire 12→second connector 51→first extension 101→second terminal part 52→mounting board" can be formed. Therefore, heat generated from the light emitting element 10 can be released more efficiently from the light emitting device 100.

Also, the first extension face 101S is exposed at the rear face 20D of the molded article 30. Specifically, the first extension 101 comes into contact with the inner face of the mold in the course of manufacturing the molded article 30. Consequently, the second connector 51 is supported by the first extension 101 in the mold, so the tiny vibrations of the second connector 51 caused by the injected resin material can be suppressed. Therefore, the resin material can work its way evenly around the second connector 51, so there is better adhesion between the molded article 30 and the second lead 50.

Fourth Embodiment

Next, a fourth embodiment will be described through reference to the drawings. The difference between the fourth and fourth embodiments is that part of the first lead 40 also sticks out toward the rear face 20D. The following description will focus on this difference.

Configuration of Light Emitting Device

Figure 21:
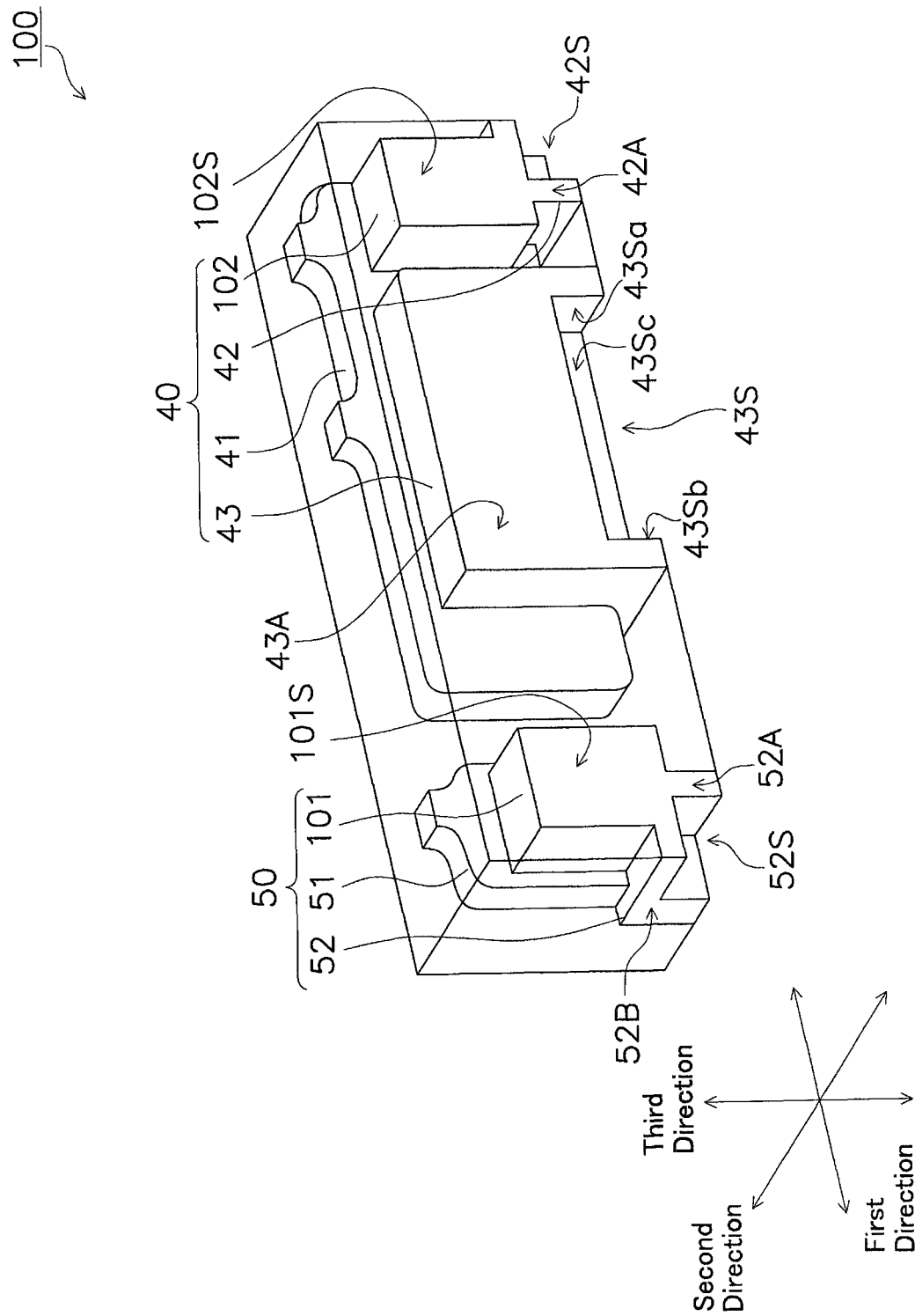
FIG. 21 is an oblique see-through view of a light emitting device 100 pertaining to a fourth embodiment, as seen from the rear.

FIG. 21 is an oblique see-through view of a light emitting device 100 pertaining to a fifth embodiment, as seen from the rear. As shown in FIG. 21, with the light emitting device 100, the first lead 40 has a second extension 102, and the second lead 50 has a first extension 101.

The configuration of the first extension 101 is as described above in the third embodiment.

The configuration of the second extension 102 is the same as the configuration of the first extension 101. The second extension 102 is disposed on the first rear face 41B of the first connector 41, and is connected to the first terminal part 42. The second extension 102 extends from the second rear face 51B of the first connector 41 on the rear face 20D side toward the rear face 20D, and is exposed from the molded article 30 at the rear face 20D. The second extension 102 has a second extension face 102S that forms part of the rear face 20D.

Method for Manufacturing Light Emitting Devices

Figure 22:
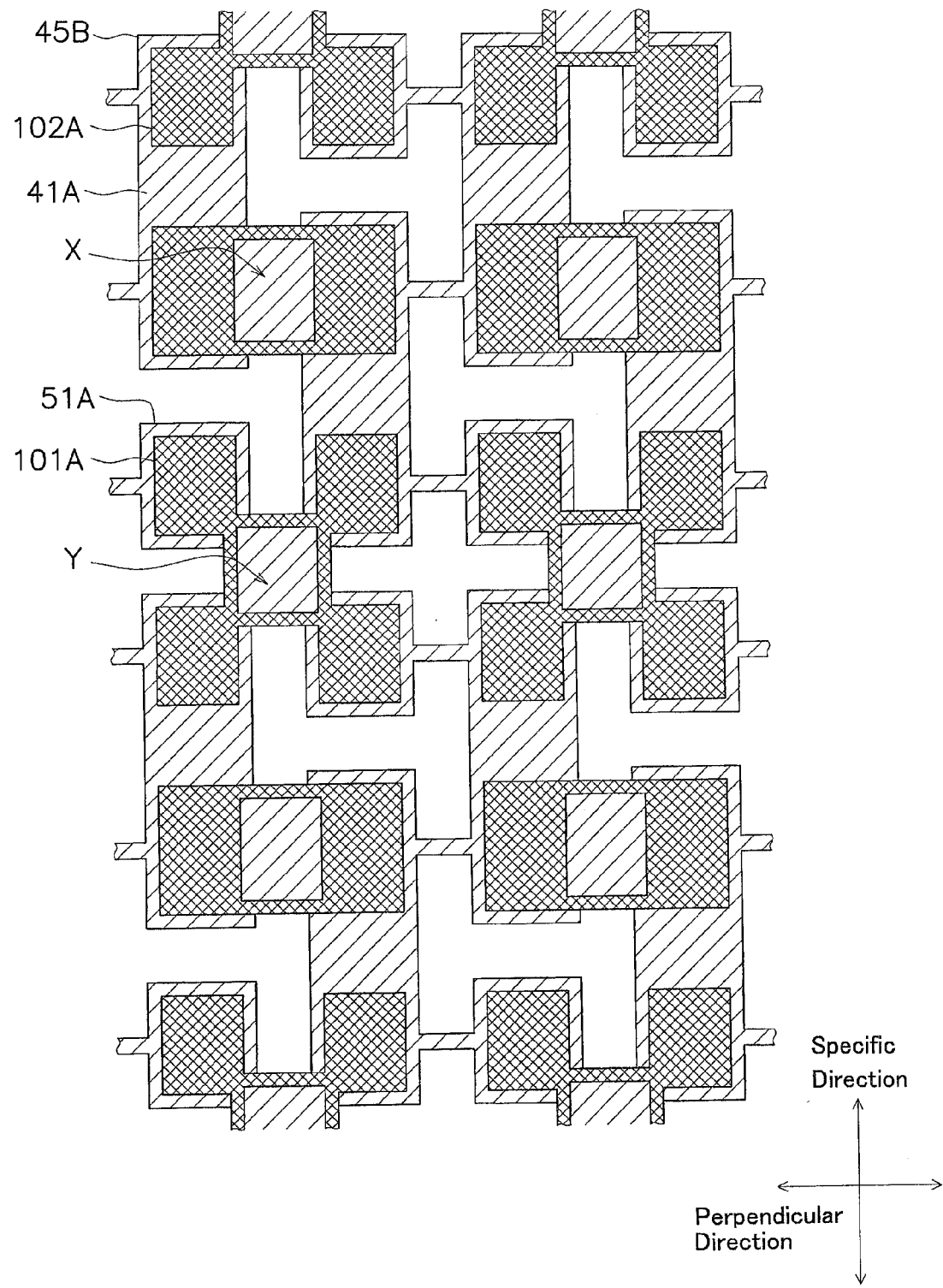
FIG. 22 is a diagram illustrating a method for manufacturing the light emitting device 100 pertaining to the fourth embodiment.

First, the lead frame 45B shown in FIG. 22 is readied. The lead frame 45B comprises a first extension base 101A and a second extension base 101B. This lead frame 45B can be formed by setting the region in which one-sided etching is performed in order to form a first connection base 41A and a second connection base 51A, as shown in FIG. 22.

With the lead frame 45B pertaining to this embodiment, the one-sided etching concavities X and the one-sided etching concavities Y are set to be larger than the lead frame 45 pertaining to the first embodiment. This raises the dimensional machining limit at which one-sided etching.

Figure 23:
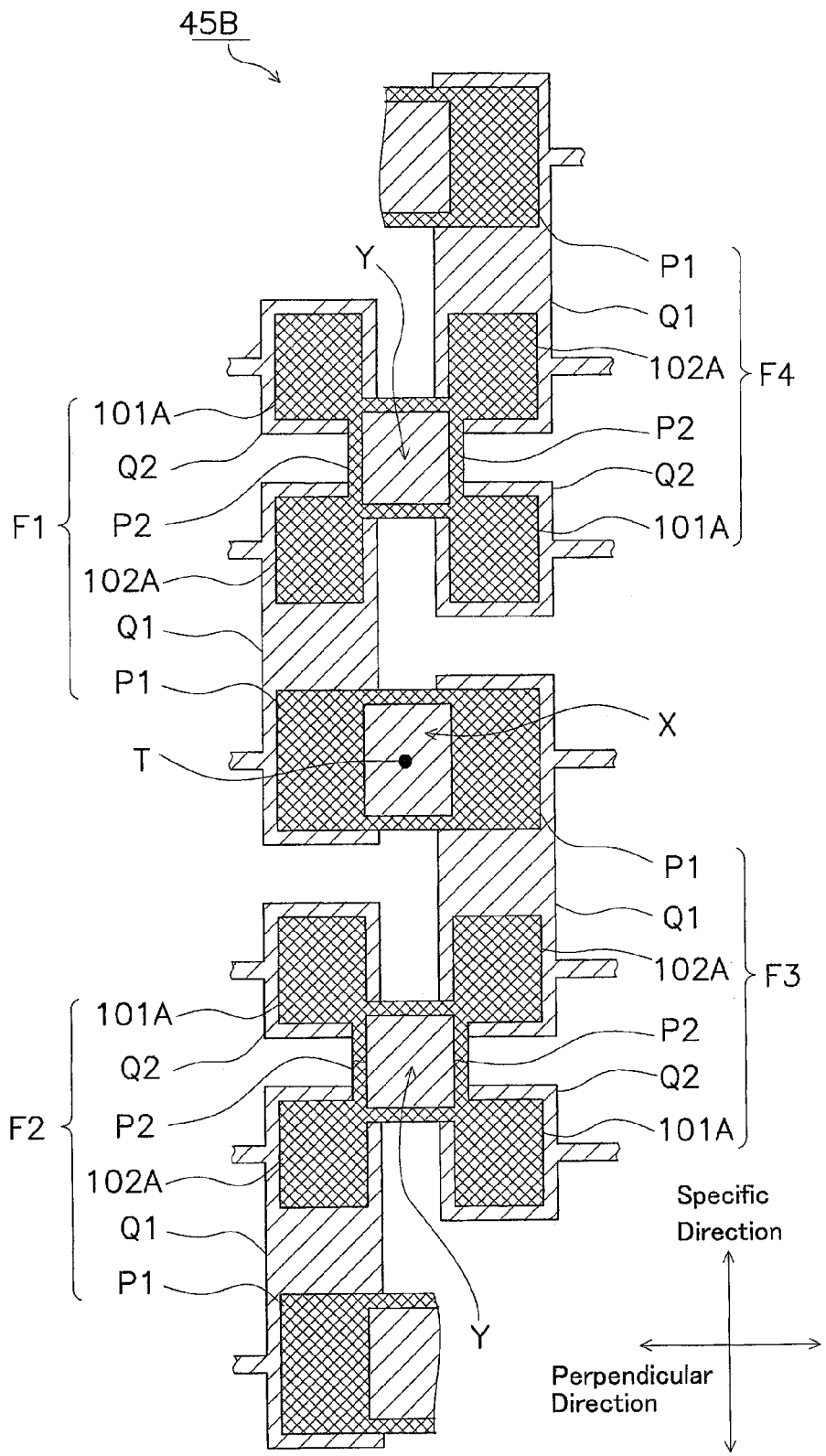
FIG. 23 is a detail view of a lead frame 45B pertaining to the fourth embodiment.

Thus, the lead frame 45B pertaining to this embodiment has a fundamentally different configuration from that of the lead frame 45 pertaining to the first embodiment. The detailed configuration of the lead frame 45B will now be described through reference to the drawings. FIG. 23 is a detail view of the lead frame 45B. As shown in FIG. 23, the lead frame 45B has first to fourth frame parts F1 to F4. The first frame part F1 and the second frame part F2 are adjacent to each other in a specific direction, but are not linked. Similarly, the third frame part F3 and the fourth frame part F4 are adjacent to each other in a specific direction, but are not linked.

In this embodiment, the third frame part F3 and the fourth frame part F4 are disposed in rotational symmetry with respect to the first frame part F1 and the second frame part F2 around an axis T that is parallel to the thickness direction (a direction that is perpendicular to the specific direction and the perpendicular direction, that is, a direction that is perpendicular to the plane of the drawing). The first thick part P1 of the third frame part F3 is directly linked to the first thick part P1 of the first frame part F1. The second thick part P2 of the third frame part F3 is directly linked to the second thick part P2 of the second frame part F2. The second thick part P2 of the fourth frame part F4 is directly linked to the second thick part P2 of the first frame part F1.

Also, in this embodiment, in a plan view of the lead frame 45B, part of the etching concavities H is formed on the inside of the first thick part P1 of the frame parts F. Consequently, the one-side etching concavities X are formed by linking the first thick part P1 of the third frame part F3 and the first thick part P1 of the first frame part F1.

In this embodiment, in a plan view of the lead frame 45D, part of the etching concavities H is formed on the inside of the second thick part P2 of the frame parts. Consequently, the one-side etching concavities Y are formed by linking the second thick part P2 of the first frame part F1 and the second thick part P2 of the fourth frame part F4. Also, the one-side etching concavities Y are formed by linking the second thick part P2 of the second frame part F2 and the second thick part P2 of the third frame part F3.

Figure 24:
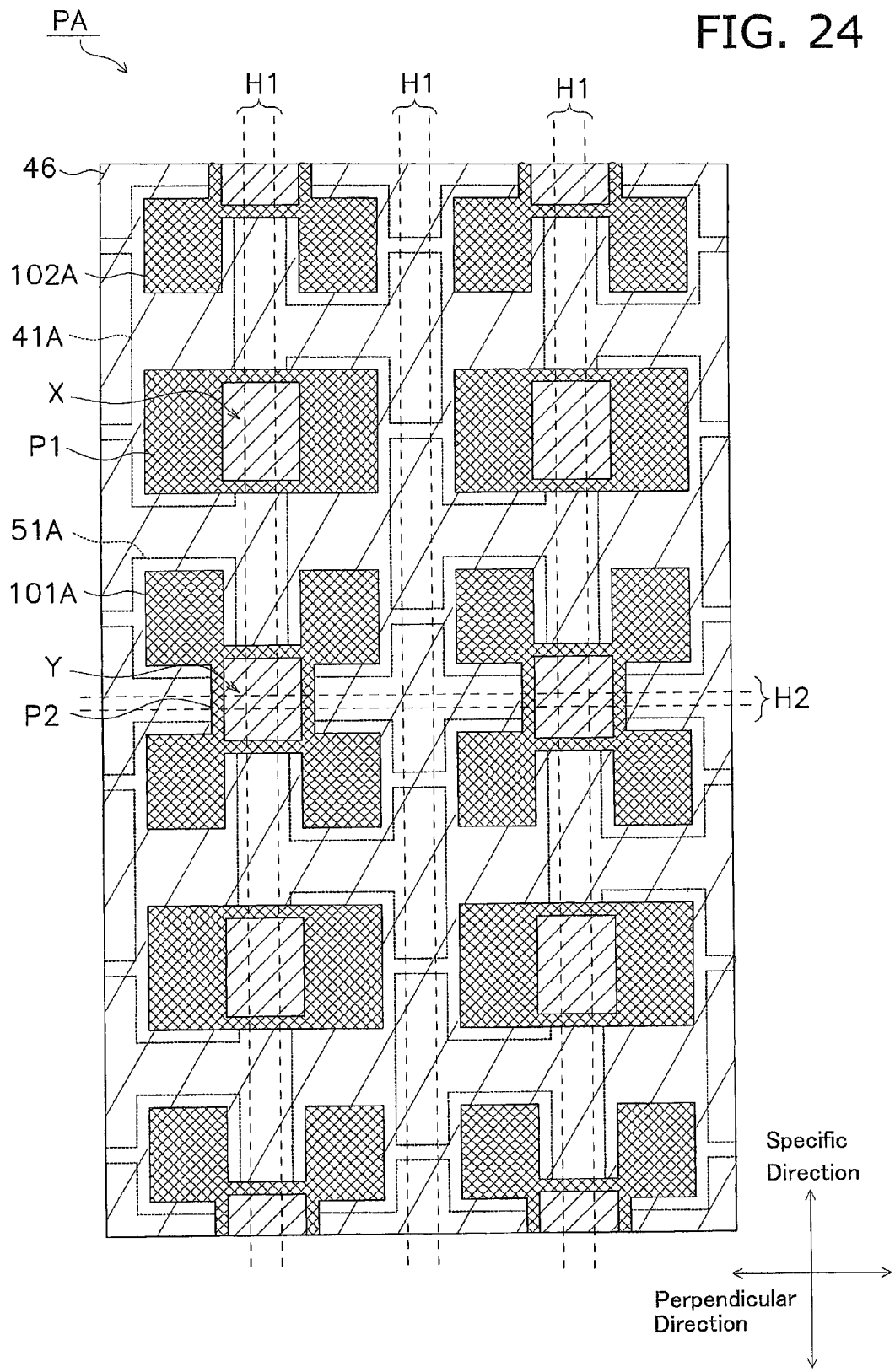
FIG. 24 is a diagram illustrating a method for manufacturing the light emitting device 100 pertaining to the fourth embodiment.

The portion where the first thick part P1 of the third frame part F3 and the first thick part P1 of the first frame part F1 are linked constitutes a cutting allowance for dicing (see FIG. 24). Similarly, the portion where the second thick part P2 of the third frame part F3 and the second thick part P2 of the second frame part F2 are linked constitutes a cutting allowance for dicing. The portion where the second thick part P2 of the fourth frame part F4 and the second thick part P2 of the first frame part F1 are linked also constitutes a cutting allowance for dicing.

Next, as shown in FIG. 24, the light emitting device package array PA is completed by embedding the lead frame 45B in a molded board 46 by transfer molding. It should be noted that the first thick part P1 and the one-side etching concavities X, and the second thick part P2 and the one-side etching concavities Y are exposed from the molded board 46 in the light emitting device package array PA.

Next, as shown in FIG. 24, the light emitting device package array PA is cut with a dicing saw along cutting lines H1 and H2 having a specific width.

Action and Effect

With the light emitting device 100 pertaining to the fourth embodiment, the first lead 40 has the second extension 102 (an example of an "extension"). The second extension 102 is disposed on the first rear face 41B of the first connector 41, and is connected to the first terminal part 42. The second extension 102 is exposed from the molded article 30 at the rear face 20D.

Thus, the second extension 102 is inserted into the molded article 30 from the first rear face 41B of the first connector 41 up to the rear face 20D. Therefore, the first lead 40 can be securely latched to the molded article 30 by the anchoring effect provided by the second extension 102.

This is especially effective when the first lead 40 is pulled in the first direction by the solder fillet. That is, when the light emitting device 100 is mounted on a mounting board, the first lead 40 is pulled in the first direction by the solidification shrinkage force of the solder fillet connected to the first terminal part 42. However, since the first lead 40 is latched to the molded article 30 at the second extension 102, it does not readily separate from the molded article 30. Accordingly, the first lead 40 can be pulled in the first direction under a greater force by the solder fillet, so the balance of the mounted light emitting device 100 can be stabilized better.

Also, since the second extension 102 is exposed from the molded article 30 at the rear face 20D, a heat dissipation path of "light emitting element 10→first connector 41→second extension 102→second extension face 102S→outside air" can be formed. Therefore, heat generated from the light emitting element 10 can be released more efficiently from the light emitting device 100.

Also, since the second extension 102 is connected to the first terminal part 42, a heat dissipation path of "light emitting element 10→first connector 41→second extension 102→first terminal part 42→mounting board" can be formed. Therefore, heat generated from the light emitting element 10 can be released more efficiently from the light emitting device 100.

Also, the second extension face 102S is exposed at the rear face 20D of the molded article 30. Specifically, the second extension 102 comes into contact with the inner face of the mold in the course of manufacturing the molded article 30. Consequently, the first connector 41 is supported by the second extension 102 in the mold, so the tiny vibrations of the first connector 41 caused by the injected resin material can be suppressed. Therefore, the resin material can work its way evenly around the first connector 41, so there is better adhesion between the molded article 30 and the first lead 40.

The effect that results from the second lead 50 having the first extension 101 is as described in the third embodiment above.

Other Embodiments

The present invention was described by the above embodiments, but the text and drawings that make up part of this disclosure should not be construed as limiting this invention. Various alternative embodiments, working examples, and applied technology will be apparent to a person skilled in the art from this disclosure.

(A) In the above embodiments, the molded article 30 grasped a plurality of locations of the first connector 41 and of the second connector 51, but this is not the only option. The molded article 30 may only grasp one location of the first connector 41 and of the second connector 51.

(B) In the above embodiments, the first lead 40 had both the first connector 41 and the support plate 432, but this is not the only option. The molded article 30 may have just the first connector 41 or the support plate 432.

(C) In the above embodiments, the light emitting device 100 comprised only a single light emitting element 10, but this is not the only option. The light emitting device 100 may comprise a plurality of light emitting elements 10 that are linked together. In this case, the light emitting elements 10 may all be of the same type, or may be a combination of different types that emit red, green, and blue light (the three primary colors of light).

(D) In the above embodiments, the exposed part 43 was formed in an L shape, but this is not the only option. The exposed part 43 may be flat, rod-shaped, cylindrical, or have some other such shape.

(E) In the above embodiments, the first terminal part 42 and the second terminal part 52 were each formed in a cuboid shape, but this is not the only option. The shapes of the first terminal part 42 and the 52 may each be suitably modified.

(F) In the above embodiments, the molded article 30 grasped the outer edges of the first connector 41 and the second connector 51 as shown in FIGS. 7 to 10, but need not grasp the outer edges of the first connector 41 and the second connector 51. Specifically, the molded article 30 need not be provided on the first connection face 41A of the first connector 41 and the second connection face 51A of the second connector 51. In this case, the inner wall of the molded article 30 exposed in the interior of the front face opening 20F may be formed in the same plane as the side faces of the first connector 41 and the second connector 51.

(G) In the above embodiments, the first connection face 41A, the first rear face 41B, and the first to sixth connector side faces $41C_1$ to $41C_6$ were depicted as intersecting at right angles, but this is not the only option. The various faces may be formed at slightly obtuse or acute angles.

(H) In the above embodiments, the lead frame 45A was formed by etching a thin metal plate, but this is not the only option. For example, the lead frame 45A can be formed by punching out a plurality of thin metal plates into the desired shape, and then compression bonding these thin metal plates together.

(I) In the above embodiments, as shown in FIG. 4, the exposed part 43 was isolated from the first terminal part 42, but this is not the only option. The exposed part 43 may be linked to the first terminal part 42. Here again, however, the exposed part 43 is preferably isolated from the first terminal part 42 at the bottom face 20A, and isolated from the first terminal part 42 on the bottom face side of the rear face 20D. This is because part of the molded article 30 can be brought into contact with the sixth connector side face $51C_6$ of the first connector 41, the second terminal part end face $42C_2$ of the first terminal part 42, and the third support plate side face $43C_3$ of the exposed part 43.

Thus, the present invention of course encompasses various embodiments, etc., that are not discussed herein. Therefore the technological scope of the present invention is defined only by the invention-defining matters pertaining to the appropriate claims from the above description.

The technology disclosed herein can be utilized in the field of light emitting devices because it improves adhesion between a molded article and a lead.

REFERENCE SIGNS LIST 100 light emitting device; 10 light emitting element; 11 first wire; 12 second wire; 20 package; 20A bottom face; 20B top face; 20C front face; 20D rear face; $20E_1$ first side face; $20E_2$ second side face; 20F front face opening; 30 molded article; 30W wall part; 40 first lead; 41 first connector; 41A first connection face; 41B first rear face; 41C connector side face; 42 first terminal part; 42A first end face; 42B second end face; 42C connector side face; 43 exposed part; 431 base part; 432 support plate; 43A exposed face; 43C support plate side face; 43S concavity; 45 lead frame; 451 thin metal plate; 46 molded board; 50 second lead; 51 second connector; 51A second connection face; 51B second rear face; 51C connector side face; 52 second terminal part; 52A first end face; 52B second end face; 52C terminal part side face; 101 first extension; 102 second extension; 201 lower mold; 202 upper mold; 203 fill port; S main face; M mask; F frame part; G etching hole; H etching concavity; P thick-walled part; Q thin-walled part; R linking frame; PA light emitting device package array; and X,Y one-sided etching concavity.

What is claimed is:

1. A light emitting device comprising:
a package constituted by a molded article and a lead, the lead being embedded in the molded article, the package being formed in a substantially cuboid shape; and
a light emitting element installed in the package,
the lead including a first lead and a second lead spaced apart from the first lead,
the first lead having a first connector, a first terminal part and an exposed part, the light emitting element being mounted on the first connector, the first terminal part and the exposed part being linked to the first connector,
the second lead having a second connector and a second terminal part, the second connector being electrically connected to the light emitting element, the second terminal part being linked to the second connector,
the package having a bottom face, a light emission face contiguous with the bottom face, and a rear face contiguous with the bottom face, the rear face being opposite the light emission face,
the first terminal part and the exposed part being linked to a rear face side of the first connector, the first terminal part being continuously exposed from the molded article at the bottom face and the rear face, the exposed part being continuously exposed from the molded article at the bottom face and the rear face,
the second terminal part being linked to a rear face side of the second connector, the second terminal part being continuously exposed from the molded article at the bottom face and the rear face, and
a bottom face of the first terminal part, a bottom face of the exposed part, and a bottom face of the second terminal part being apart from each other at the bottom face of the package.

2. The light emitting device according to claim 1, wherein the package has an opening formed in the light emission face, and sealing resin that fills the opening, and the first connector is exposed in an interior of the opening.

3. The light emitting device according to claim 1, wherein the first lead has an extension that is linked to the first connector and the first terminal part and is exposed from the molded article at the rear face.

4. The light emitting device according to claim 1, wherein the first connector, the first terminal part and the exposed part of the first lead are formed as a one-piece, unitary member.

5. The light emitting device according to claim 1, wherein the second lead has an extension that is linked to the second connector and the second terminal part and is exposed from the molded article at the rear face.

6. A light emitting device comprising:
a package constituted by a molded article and a lead, the lead being embedded in the molded article, the package being formed in a substantially cuboid shape; and
a light emitting element installed in the package,
the lead including a first lead and a second lead spaced apart from the first lead,
the first lead having a first connector, a first terminal part and an exposed part, the light emitting element being mounted on the first connector, the first terminal part and the exposed part being linked to the first connector,
the second lead having a second connector and a second terminal part, the second connector being electrically connected to the light emitting element, the second terminal part being linked to the second connector,
the package having a bottom face, a light emission face contiguous with the bottom face, and a rear face contiguous with the bottom face, the rear face being opposite the light emission face,
the it terminal part and the exposed part being linked to a rear face side of the first connector, the first terminal part being continuously exposed from the molded article at the bottom face and the rear face, the exposed part being continuously exposed from the molded article at the bottom face and the rear face, the second terminal part being linked to a rear face side of the second connector, the second terminal part being continuously exposed from the molded article at the bottom face and the rear face, and a rear face of the first terminal part, a rear face of the exposed part, and a rear face of the second terminal part being apart from each other at a bottom face side of the rear face of the package.

7. The light emitting device according to claim 6, wherein the first connector, the first terminal part and the exposed part of the first lead are formed as a one-piece, unitary member.

* * * * *